United States Patent
Kurosawa et al.

(10) Patent No.: US 12,087,396 B2
(45) Date of Patent: Sep. 10, 2024

(54) MEMORY SYSTEM

(71) Applicant: KIOXIA CORPORATION, Tokyo (JP)

(72) Inventors: Takehisa Kurosawa, Yokohama Kanagawa (JP); Akio Sugahara, Yokohama Kanagawa (JP); Mitsuhiro Abe, Kawasaki Kanagawa (JP); Hisashi Fujikawa, Ebina Kanagawa (JP); Yuji Nagai, Sagamihara Kanagawa (JP); Zhao Lu, Ebina Kanagawa (JP)

(73) Assignee: Kioxia Corporation, Tokyo (JP)

( * ) Notice: Subject to any disclaimer, the term of this patent is extended or adjusted under 35 U.S.C. 154(b) by 191 days.

(21) Appl. No.: 17/898,981

(22) Filed: Aug. 30, 2022

(65) Prior Publication Data

US 2023/0282257 A1    Sep. 7, 2023

(30) Foreign Application Priority Data

Mar. 1, 2022  (JP) ................................. 2022-031154

(51) Int. Cl.
*G11C 7/22*    (2006.01)
*G11C 7/10*    (2006.01)
*G11C 7/20*    (2006.01)

(52) U.S. Cl.
CPC ............ *G11C 7/222* (2013.01); *G11C 7/1069* (2013.01); *G11C 7/20* (2013.01)

(58) Field of Classification Search
CPC .................................. G11C 7/222; G11C 7/22
USPC ...................................................... 365/233.1
See application file for complete search history.

(56) References Cited

U.S. PATENT DOCUMENTS

| | | |
|---|---|---|
| 8,386,694 B2 | 2/2013 | Sukegawa |
| 11,381,425 B2* | 7/2022 | Yamamoto ......... H03K 19/0005 |
| 2008/0005493 A1* | 1/2008 | Chung ................. G11C 7/1075 |
| | | 711/149 |
| 2010/0017541 A1 | 1/2010 | Yamashita et al. |
| 2015/0262630 A1 | 9/2015 | Shirakawa et al. |
| 2018/0053556 A1* | 2/2018 | Yanagidaira ........... G11C 16/26 |
| 2022/0011974 A1 | 1/2022 | Lee et al. |

FOREIGN PATENT DOCUMENTS

| | | |
|---|---|---|
| JP | H03-105796 A | 5/1991 |
| JP | 2008-033648 A | 2/2008 |
| JP | 2010-044750 A | 2/2010 |
| JP | 2015-176309 A | 10/2015 |

* cited by examiner

*Primary Examiner* — Muna A Techane
(74) *Attorney, Agent, or Firm* — Kim & Stewart LLP

(57) ABSTRACT

A memory system includes a memory controller and a semiconductor storage device including a power supply pad, first, second, third, and fourth signal pads to which first, second, third, and fourth signals are respectively input, a memory cell array, a data register, and a control circuit executing an operation to output data stored in the data register through the fourth signal pad. The memory controller performs a mode setting operation by toggling the third signal input, after at least the first or second signal has been switched at a first timing after supplying power to the power supply pad, perform an initial setting operation by transmitting a power-on read command at a second timing after the first timing, and transmit a data-out command, at a third timing after the second timing. The semiconductor storage device receives the power-on read and data-out commands via the first and second signal pads.

20 Claims, 17 Drawing Sheets

FIG. 8
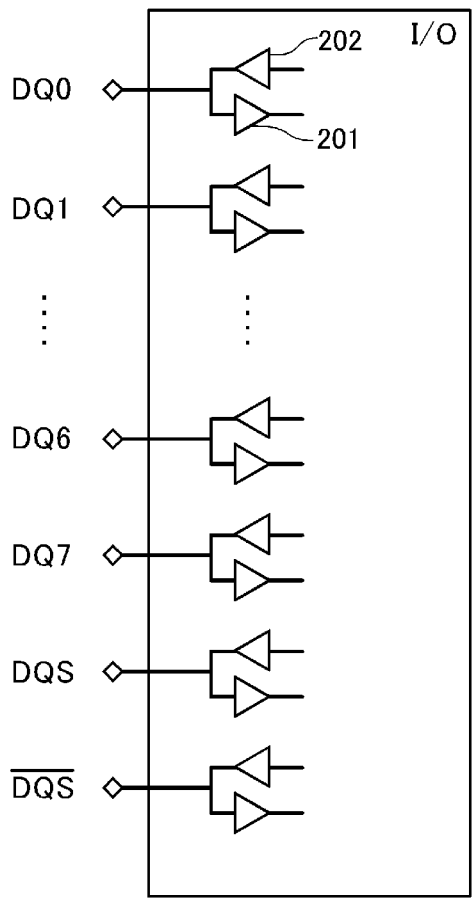
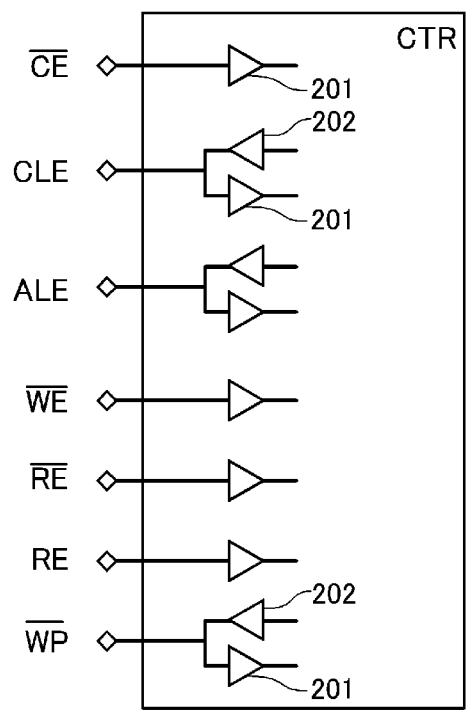

FIG. 11

| MODEa | CLE | ALE | CE̅ | W̅E̅ | R̅E̅ | DQS | DQ |
|---|---|---|---|---|---|---|---|
| Cmd/Add | H/L | L/H | L | ⊓⊔ | H | Z | Input |
| DataInput | L | L | L | H | H | output ⊓⊔ | Input |
| DataOutput | L | L | L | H | ⊓⊔ | output ⊓⊔ | Output |
| StatusOutput | L | L | L | H | ⊓⊔ | ⊓⊔ | Output |
| Standby | Z | Z | H | Z | Z | Z | Z |
| Bus Idle | L | L | L | H | X | X | Z |

FIG. 12

| MODEb @ FSel | CLE | ALE | CE̅ | W̅E̅ | R̅E̅ | DQS | DQ |
|---|---|---|---|---|---|---|---|
| Cmd | H | L | L | ⊓⊔ | | | |
| Add | L | H | L | ⊓⊔ | | | |
| StatusOutput | L | L | L | ⊓⊔ | | | |

FIG. 13

| MODEb @ S_In, S_Out | CLE | ALE | CE̅ | W̅E̅ | R̅E̅ | DQS | DQ |
|---|---|---|---|---|---|---|---|
| Cmd/Add | input | input | L | ⊓⊔ | | | |
| DataInput | | | L | | H | ⊓⊔ | Input |
| DataOutput | | | L | | ⊓⊔ | output ⊓⊔ | Output |
| StatusOutput | Output | Output | L | ⊓⊔ | | | |
| Standby | Z | Z | H | Z | Z | Z | Z |
| Bus Idle | L | L | L | H | X | X | Z |

MEMORY SYSTEM

CROSS-REFERENCE TO RELATED APPLICATION

This application is based upon and claims the benefit of priority from Japanese Patent Application No. 2022-031154, filed Mar. 1, 2022, the entire contents of which are incorporated herein by reference.

FIELD

Embodiments described herein relate generally to a memory system.

BACKGROUND

A memory system having a plurality of semiconductor storage devices and a control device is known. The semiconductor storage device includes a memory cell array including a string in which a plurality of memory cell transistors are connected in series and a control circuit that is connected to the memory cell array and outputs user data in response to an input of a command set including command data and address data.

DESCRIPTION OF THE DRAWINGS

FIG. 8 is a schematic circuit diagram showing an I/O circuit and a logic circuit of the memory die in more detail.

FIG. 11 is a truth table illustrating the operation mode MODEa.

FIG. 12 is a truth table illustrating the operation mode MODEb.

FIG. 13 is a truth table illustrating the operation mode MODEb.

DETAILED DESCRIPTION

In general, according to one embodiment, a memory system includes a semiconductor storage device and a memory controller. The semiconductor storage device includes a power supply pad to which power is supplied, a first signal pad to which a first signal is input, a second signal pad to which a second signal is input, a third signal pad to which a third signal is input, a fourth signal pad to which a fourth signal is input, a memory cell array, a data register in which data read from the memory cell array are stored, and a control circuit capable of executing a data-out operation of outputting the data stored in the data register through the fourth signal pad. The memory controller performs a mode setting operation by toggling the third signal input to the third signal pad, after at least one of the first signal input to the first signal pad and the second signal input to the second signal pad has been switched from a first level to a second level at a first timing after supplying power to the power supply pad, perform an initial setting operation by transmitting a power-on read command to the semiconductor storage device at a second timing after the first timing, and transmit a data-out command to the semiconductor storage device, at a third timing after the second timing. The semiconductor storage device receives the power-on read command and the data-out command via the first signal pad and the second signal pad.

Next, the memory system according to the embodiment will be described in detail with reference to the drawings. The following embodiments are merely examples and are not intended to limit the present disclosure.

Further, when the term "memory system" is used in the present specification, it may mean a system including a controller die, such as a memory card or SSD. Further, it may mean a configuration including a host computer such as a smartphone, a tablet terminal, a personal computer, and the like.

Further, in the present specification, when a first configuration is said to be "electrically connected" to a second configuration, the first configuration may be directly connected to the second configuration or the first configuration may be connected to the second configuration via wiring, a semiconductor member, a transistor, or the like. For example, when three transistors are connected in series, the first transistor is "electrically connected" to the third transistor, even if the second transistor, which is between the first and third transistors, is in the OFF state.

Further, in the present specification, when a first configuration is said to be "connected between" a second configuration and a third configuration, it may mean that the first configuration, the second configuration, and the third configuration are connected in series and that the second configuration is connected to the third configuration via the first configuration.

First Embodiment

[Memory System 10]

Figure 1:
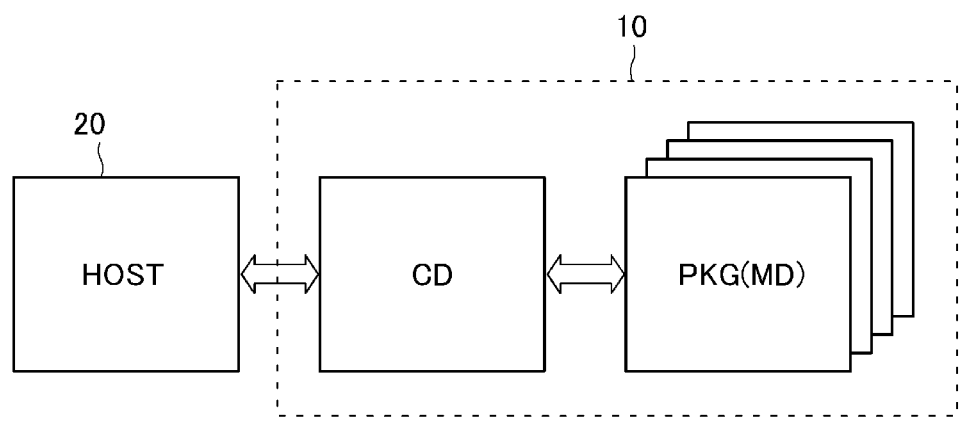
FIG. 1 is a schematic block diagram showing a configuration of a memory system according to a first embodiment.

FIG. 1 is a schematic block diagram showing a configuration of a memory system 10 according to a first embodiment.

The memory system 10 reads, writes and erases user data according to the signal transmitted from a host computer 20. The memory system 10 is, for example, a system capable of storing a memory card, SSD, or other user data. The memory system 10 includes a plurality of packages PKG and a controller die CD connected to the plurality of packages PKG and the host computer 20. Each package PKG includes a plurality of memory dies MD. Each memory die MD can store user data. The controller die CD includes, for example, a processor, a RAM, and the like and performs processing such as conversion between a logical address and a physical address, bit error detection and correction, garbage collection (also referred to as compaction), and wear leveling.

Figure 2A:
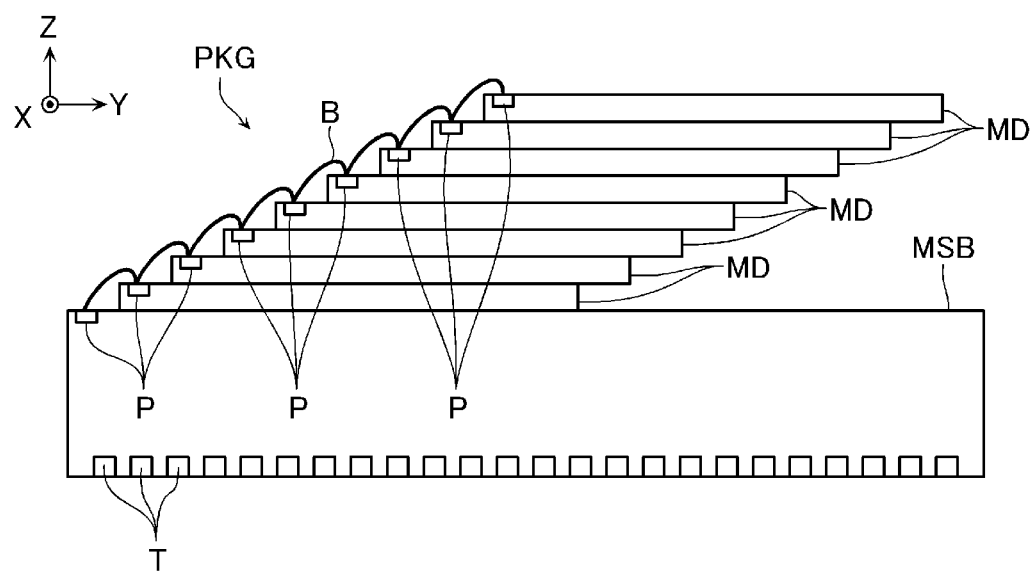
FIG. 2A is a schematic side view showing a configuration example of the package.
Figure 2B:
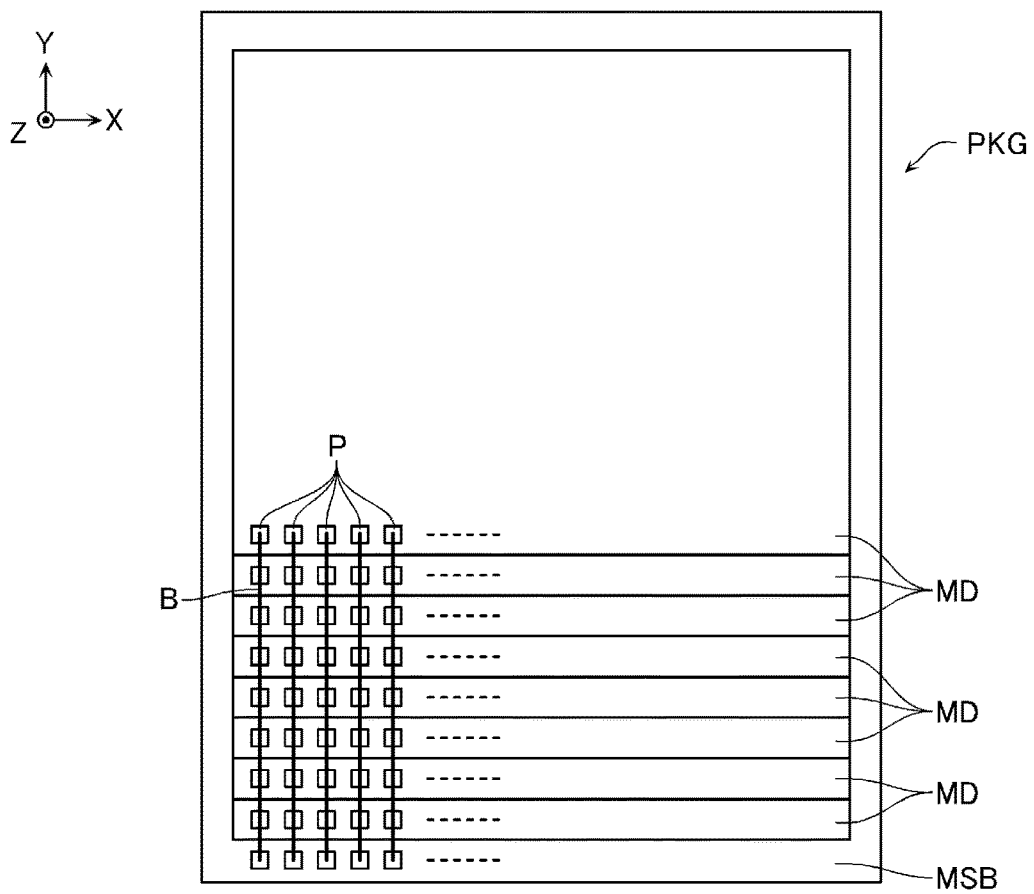
FIG. 2B is a schematic plan view showing a configuration example of the package.
Figure 3:
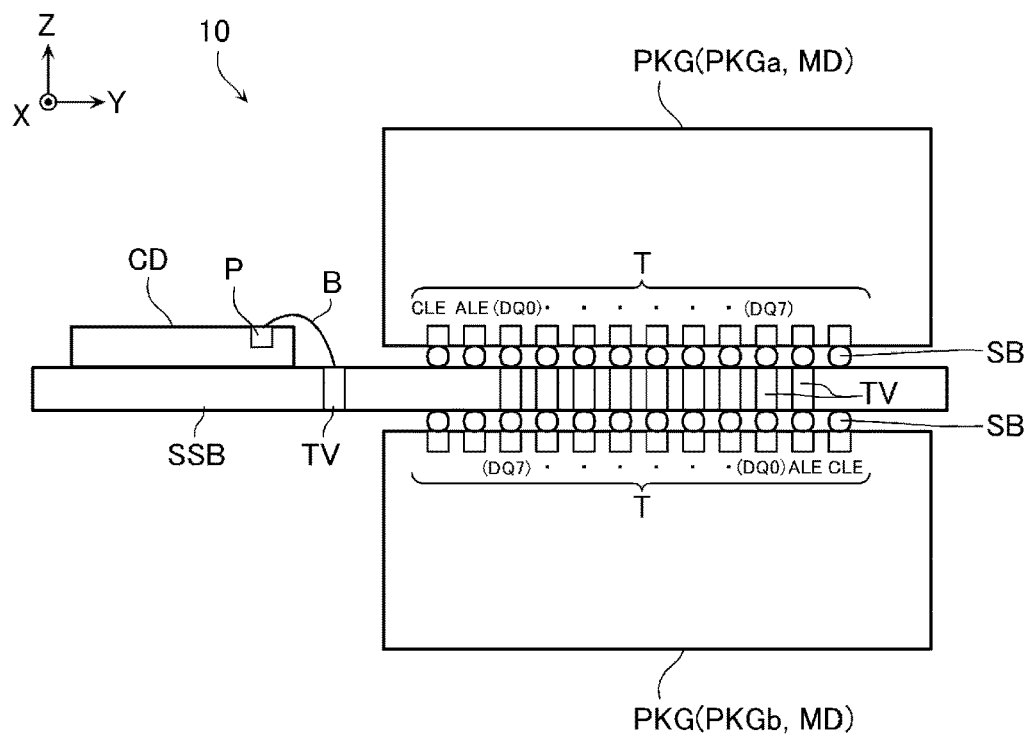
FIG. 3 is a schematic side view showing another configuration example of the memory system.

FIGS. 2A and 2B are diagrams showing a configuration example of a package PKG provided in the memory system 10 according to the present embodiment. More specifically, FIG. 2A is a schematic side view showing a configuration example of the package PKG, and FIG. 2B is a schematic plan view showing the configuration example of the package PKG. Further, FIG. 3 is a schematic side view showing another configuration example of the memory system 10. For the convenience of explanation, some configurations are omitted in FIGS. 2A, 2B, and 3.

As shown in FIG. 2A, the package PKG according to the present embodiment includes a memory die mounting board MSB and a plurality of memory dies MD stacked on the memory die mounting board MSB. Pad electrodes P are provided in the region of the end portion of the upper surface of the memory die mounting board MSB in the Y direction, and a part of the other regions is adhered to the lower surface of the memory die MD via an adhesive or the like. Pad electrodes P are provided in the region of the end portion of the upper surface of the memory die MD in the Y direction, and the other regions are adhered to the lower surface of another memory die MD via an adhesive or the like. The corresponding pad electrodes P among the plurality of memory dies MD are commonly connected by bonding wires B. Electrode terminals T are provided on the lower surface of the memory die mounting board MSB. The pad electrodes P on the upper surface of the memory die mounting board MSB are connected to the electrode terminals T on the lower surface, respectively. The memory die mounting board MSB may be, for example, a grid array board. On the upper surface of the memory die mounting board MSB, the plurality of memory dies MD and the bonding wires B are covered with, for example, a sealing resin (not shown).

Further, as shown in FIG. 2B, the memory die mounting board MSB and the plurality of memory dies MD each include a plurality of pad electrodes P located along the X direction. The plurality of pad electrodes P of each memory die MD respectively correspond to external control terminals /CE, CLE, ALE, /WE, /RE, RE, and /WP, data signal input and output terminals DQ0 to DQ7, and data strobe signal input and output terminals DQS and /DQS, and a terminal RY//BY, which will be described later.

The memory die mounting board MSB and the plurality of pad electrodes P provided on the plurality of memory dies MD are connected to each other via the bonding wires B. For example, among the plurality of memory dies MD, the pad electrodes P corresponding to the external control terminal CLE are connected to each other, and the pad electrodes P corresponding to the external control terminal ALE are connected to each other. The same applies to other terminals. Therefore, the pad electrode P of each memory die MD in the package PKG is connected to the outside of the package PKG via the electrode terminal T on the lower surface of the memory die mounting board MSB.

FIG. 3 is a schematic side view showing another configuration example of the memory system 10 according to the present embodiment. The memory system 10 includes a system mounting board SSB, a plurality of packages PKG (memory dies MD) disposed on the system mounting board SSB, and a controller die CD. The controller die CD and one package PKG are disposed on the upper surface of the system mounting board SSB. Another package PKG is disposed on the lower surface of the system mounting board SSB.

The controller die CD is provided with a plurality of pad electrodes P. The pad electrode P of the controller die CD is connected to the system mounting board SSB via a bonding wire B. The electrode terminals T of the plurality of packages PKG are connected to the system mounting board SSB via the solder balls SB. The pad electrodes P of the controller die CD and the electrode terminals T of the plurality of packages PKG are connected by wiring (not shown) formed on the upper surface and the lower surface of the system mounting board SSB. The upper surface and the lower surface of the system mounting board SSB are connected by a through via TV.

A part of the electrode terminals T of the package PKG disposed on the upper surface of the system mounting board SSB and a part of the electrode terminals T of the package PKG disposed on the lower surface of the system mounting board SSB may be connected by the through via TV. More specifically, the electrode terminals T corresponding to the data signal input and output terminals DQ0 to DQ7 in the package PKG disposed on the upper surface of the system mounting board SSB, and the electrode terminals T corresponding to the data signal input and output terminals DQ0 to DQ7 in the package PKG disposed on the lower surface of the system mounting board SSB may be connected to each other via the through via TV, respectively.

When the package PKG has the same configuration, for example, the electrode terminal T corresponding to the data signal input and output terminal DQ0 in one package PKG is connected to the electrode terminal T corresponding to the data signal input and output terminal DQ7 in the other package PKG (FIG. 3). Here, one package PKG is called a normal connection package PKGa, and the other package PKG is called a reverse connection package PKGb. The electrode terminals T corresponding to the data signal input and output terminals DQ1, 2, 3, 4, 5, 6, and 7 in the normal connection package PKGa are connected to the electrode terminals T corresponding to the data signal input and output terminals DQ 6, 5, 4, 3, 2, 1, and 0 in the reverse connection package PKGb, respectively. Such a connection method is called a mirror connection.

The electrode terminal T corresponding to the other external control terminals is individually connected to the pad electrode P of the controller die CD. For example, the electrode terminal T corresponding to the external control terminal CLE in one package PKG (normal connection package PKGa) and the electrode terminal T corresponding to the external control terminal CLE in the other package PKG (reverse connection package PKGb) are connected to the pad electrode P of the controller die CD by different wiring, respectively. Further, the electrode terminal T corresponding to the external control terminal ALE in one package PKG (normal connection package PKGa) and the electrode terminal T corresponding to the external control terminal ALE in the other package PKG (reverse connection package PKGb) are connected to the pad electrode P of the controller die CD by different wiring, respectively.

The configurations shown in FIGS. 2A, 2B, and 3 are merely examples and the specific configurations may be adjusted as appropriate. For example, in the example shown in FIGS. 2A and 2B, a plurality of memory dies MD are stacked and these configurations are connected by bonding wires B. However, the plurality of memory dies MD may be connected to each other via a through via or the like instead of the bonding wire B. Further, in the example shown in FIG. 3, an example is shown in which the electrode terminals T (data signal input and output terminals DQ0 to DQ7) of the package PKG disposed above and below the system mounting board SSB are mirror-connected by the through via TV. However, the electrode terminals T (data signal input and output terminals DQ0 to DQ7) of the package PKG do not have to be mirror-connected.

[Configuration of Memory Die MD]

Figure 4:
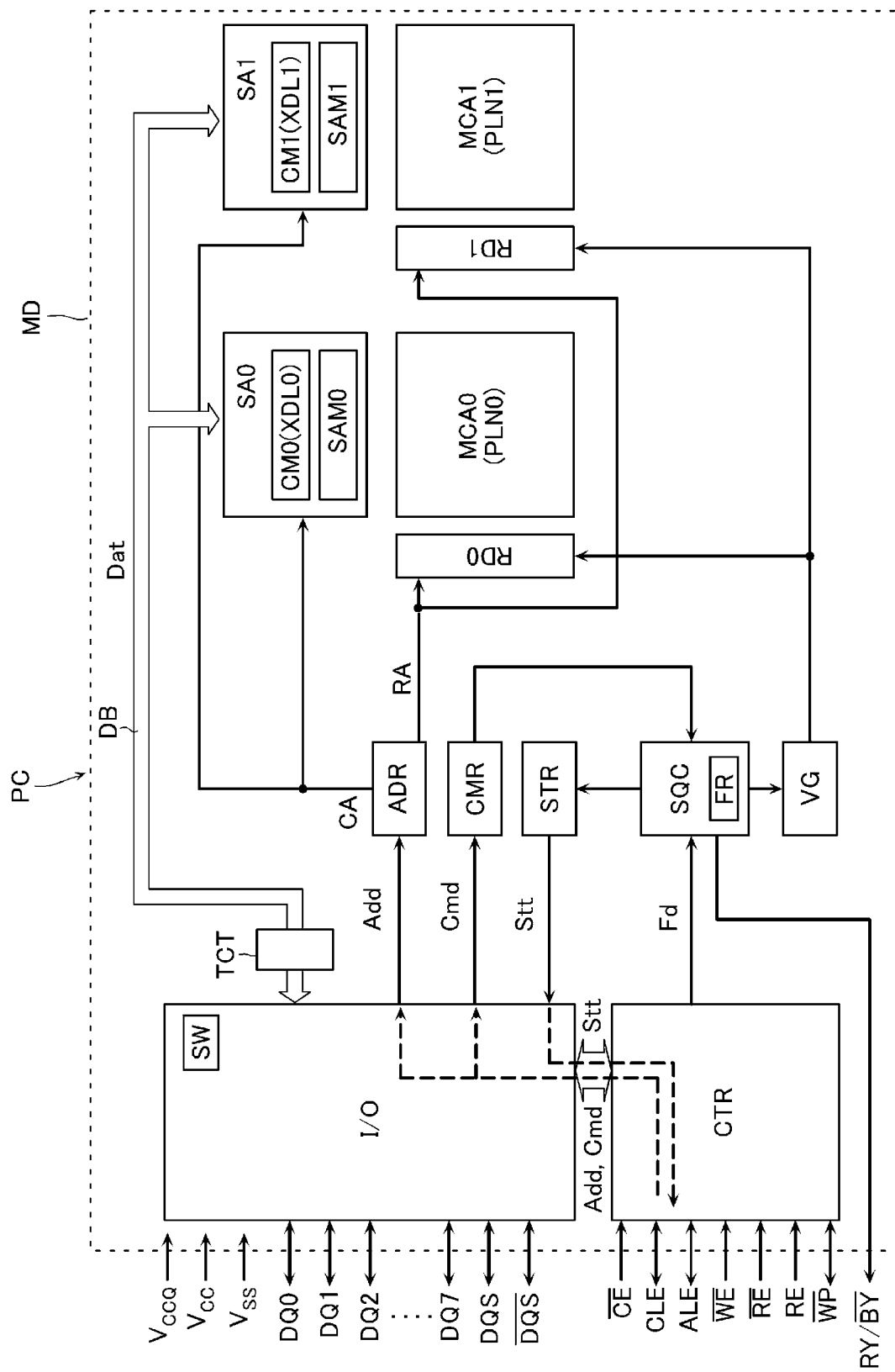
FIG. 4 is a schematic block diagram showing a configuration of a memory die.
Figure 5:
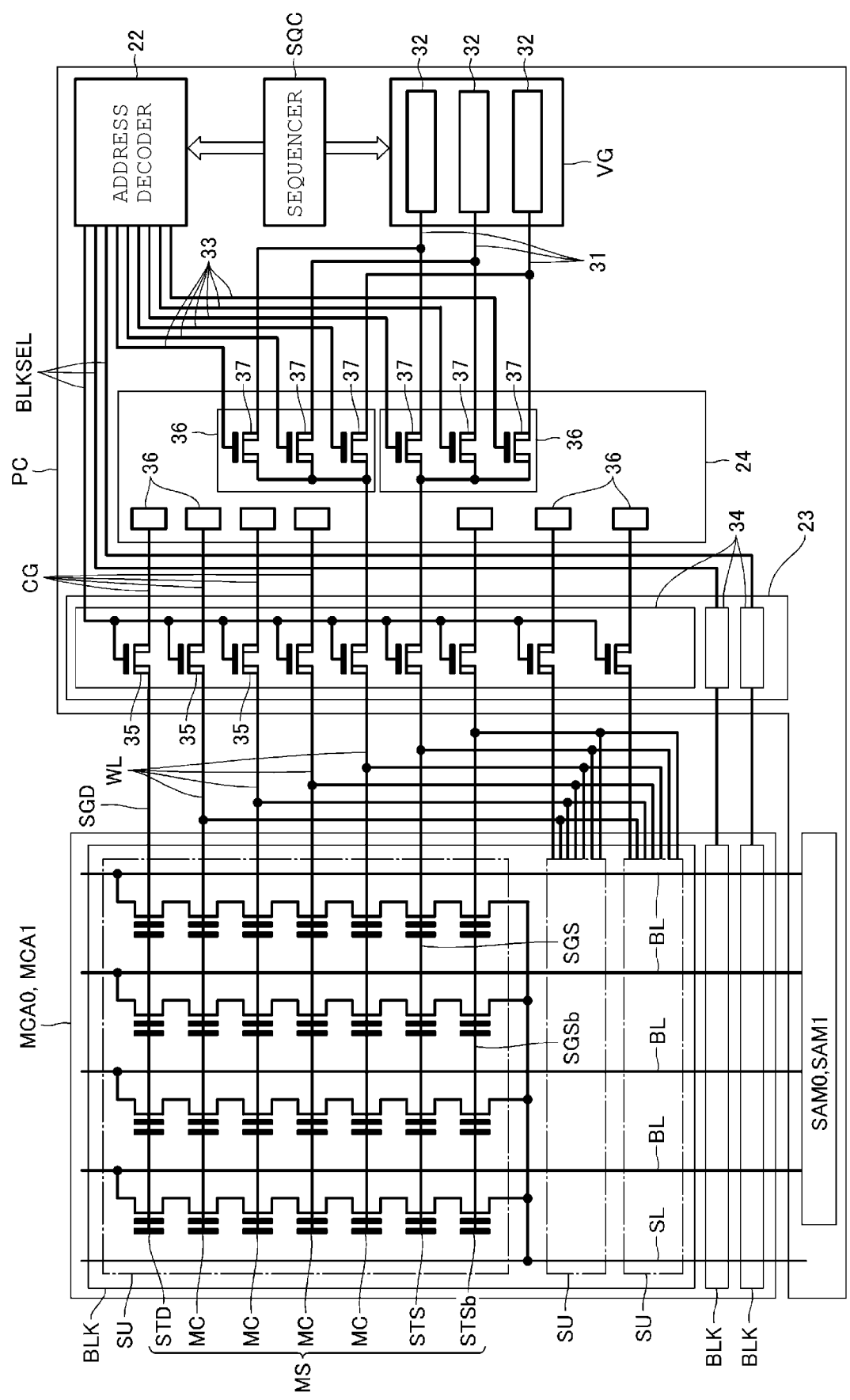
FIG. 5 is a schematic circuit diagram showing a partial configuration of the memory die.
Figure 6:
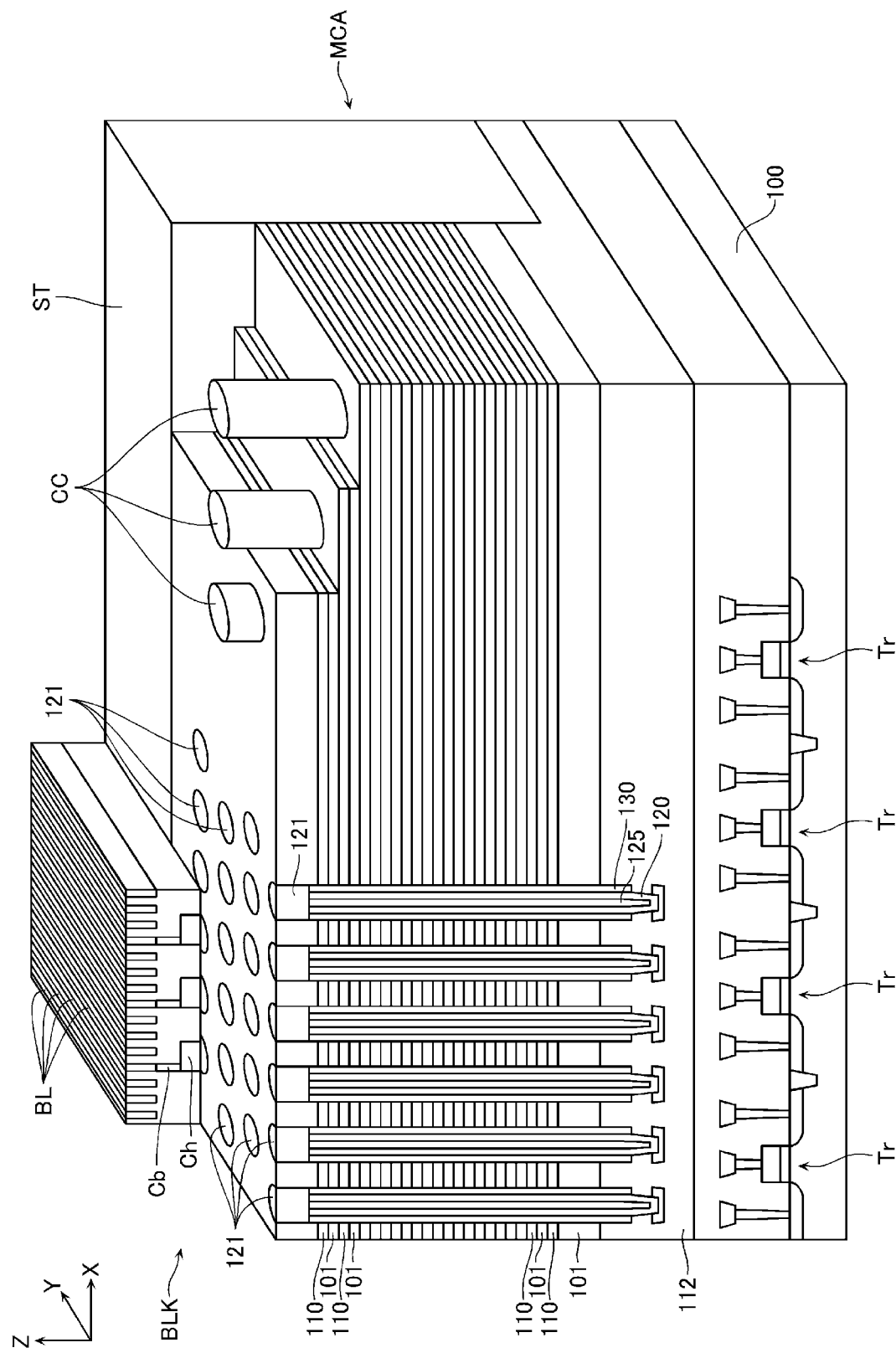
FIG. 6 is a schematic perspective view showing a partial configuration of the memory die.
Figure 7:
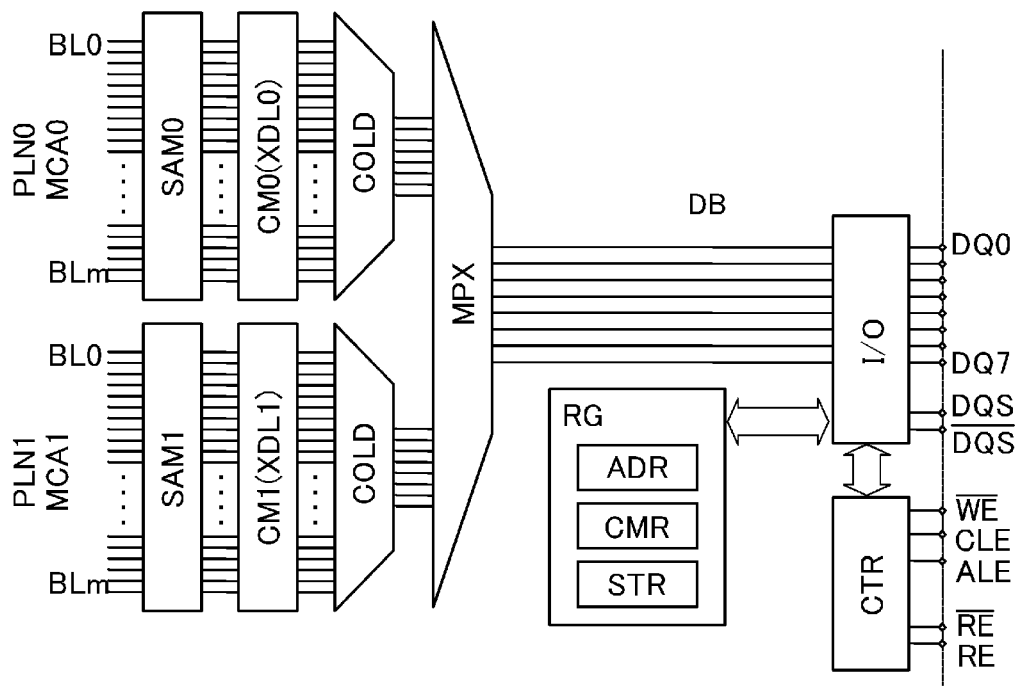
FIG. 7 is a schematic circuit diagram showing a partial configuration of the memory die.

FIG. 4 is a schematic block diagram showing a configuration of the memory die MD according to the first embodiment. FIG. 5 is a schematic circuit diagram showing a partial configuration of the memory die MD. FIG. 6 is a schematic perspective view showing a partial configuration of the memory die MD. FIGS. 7 and 8 are schematic circuit diagrams showing a partial configuration of the memory die MD. For the convenience of explanation, some configurations are omitted in FIGS. 4 to 8.

FIG. 4 illustrates a plurality of control terminals and the like. The plurality of control terminals may be represented as a control terminal corresponding to a high active signal (positive logic signal), a control terminal corresponding to a low active signal (negative logic signal), and a control terminal corresponding to both the high active signal and the low active signal. In FIG. 4, the code of the control terminal corresponding to the low active signal includes an overline. In the present specification, the code of the control terminal corresponding to the low active signal includes a slash ("/"). The description in FIG. 4 is an example and the specific embodiment may be adjusted as appropriate. For example, a part or all of the high active signal may be a low active signal, or a part or all of the low active signal may be a high active signal.

Further, next to the plurality of control terminals shown in FIG. 4, an arrow indicating an input and output direction is shown. In FIG. 4, the control terminals with left-to-right arrows can be used to input data or other signals from the controller die CD to the memory die MD. In FIG. 4, the control terminals with right-to-left arrows can be used to output data or other signals from the memory die MD to the controller die CD. In FIG. 4, the control terminals with bidirectional arrows on the left and right can be used for both the input of data or other signals from the controller die CD to the memory die MD and the output of the data or other signals from the memory die MD to the controller die CD.

As shown in FIG. 4, the memory die MD includes memory cell arrays MCA0 and MCA1 for storing user data, and a peripheral circuit PC connected to the memory cell arrays MCA0 and MCA1. In the following description, the memory cell arrays MCA0 and MCA1 may be referred to as a memory cell array MCA. Further, the memory cell arrays MCA0 and MCA1 may be referred to as planes PLN0 and PLN1.

[Configuration of Memory Cell Array MCA]

The memory cell array MCA includes a plurality of memory blocks BLK as shown in FIG. 5. Each of the plurality of memory blocks BLK includes a plurality of string units SU. Each of the plurality of string units SU includes a plurality of memory strings MS. One end of each of the plurality of memory strings MS is connected to the peripheral circuit PC via a bit line BL. Further, the other ends of the plurality of memory strings MS are each connected to the peripheral circuit PC via a common source line SL.

The memory string MS includes a drain-side select transistor STD connected in series between the bit line BL and the source line SL, a plurality of memory cells MC (memory cell transistors), a source-side select transistor STS, and a source-side select transistor STSb. Hereinafter, the drain-side select transistor STD, the source-side select transistor STS, and the source-side select transistor STSb may be simply referred to as select transistors (STD, STS, and STSb).

The memory cell MC is a field effect transistor provided with a semiconductor layer, a gate insulating film, and a gate electrode. The semiconductor layer functions as a channel region. The gate insulating film includes a charge storage film. The threshold voltage of the memory cell MC changes according to the amount of charge in the charge storage film. The memory cell MC stores one-bit or a plurality of bits of user data. A word line WL is connected to each of the gate electrodes of the plurality of memory cells MC corresponding to one memory string MS. Each of these word lines WL is commonly connected to all memory strings MS in one memory block BLK.

The select transistor (STD, STS, and STSb) is a field effect transistor including a semiconductor layer, a gate insulating film, and a gate electrode. The semiconductor layer functions as a channel region. Select gate wires (SGD, SGS, and SGSb) are connected to the gate electrodes of the select transistors (STD, STS, and STSb), respectively. The drain-side select gate line SGD is provided for each string unit SU and is commonly connected to all the memory strings MS in one string unit SU. The source-side select gate line SGS is commonly connected to all memory strings MS in the memory block BLK. The source-side select gate line SGSb is commonly connected to all memory strings MS in the memory block BLK.

The memory cell array MCA is provided above the semiconductor substrate 100, for example, as shown in FIG. 6. In the example of FIG. 6, a plurality of transistors Tr including a peripheral circuit PC are provided between the semiconductor substrate 100 and the memory cell array MCA.

The memory cell array MCA includes a plurality of memory blocks BLK disposed in the Y direction. Further, an inter-block insulating layer ST such as silicon oxide ($SiO_2$) is provided between two memory blocks BLK adjacent to each other in the Y direction.

As shown in FIG. 6, for example, the memory block BLK includes a plurality of conductive layers 110 located in the Z direction, a plurality of semiconductor columns 120 extending in the Z direction, and a plurality of gate insulating films 130 each provided between the plurality of conductive layers 110 and the plurality of semiconductor columns 120.

The conductive layer 110 is a substantially plate-shaped conductive layer extending in the X direction and the Y direction. The conductive layer 110 may include a barrier conductive film such as titanium nitride (TiN) and a stacked film of a metal film such as tungsten (W). Further, the conductive layer 110 may contain, for example, polycrystalline silicon containing impurities such as phosphorus (P) and boron (B). An insulating layer 101 such as silicon oxide ($SiO_2$) is provided between the plurality of conductive layers 110 located in the Z direction.

Further, among the plurality of conductive layers 110, the two or more conductive layers 110 located at the lowest layer function as the source-side select gate lines SGS and SGSb (FIG. 5) and the gate electrodes of the plurality of source-side select transistors STS and STSb connected thereto. The plurality of conductive layers 110 functioning as the source-side select gate lines SGS and SGSb are electrically isolated between memory blocks BLK.

Further, the plurality of conductive layers 110 located above the source-side select gate lines SGS and SGSb function as the word lines WL (FIG. 5) and the gate electrodes of the plurality of memory cells MC (FIG. 5) connected to the word lines WL (FIG. 5). Each of the plurality of conductive layers 110 functioning as a word line WL is electrically isolated between memory blocks BLK.

Further, one or more conductive layers 110 located above the word lines WL function as the drain-side select gate line SGD and the gate electrodes of the plurality of drain-side select transistors STD (FIG. 5) connected to the drain-side select gate line SGD. The plurality of conductive layers 110 have a smaller width in the Y direction than the other conductive layers 110.

A semiconductor layer 112 is provided below the conductive layer 110. The semiconductor layer 112 may include, for example, polycrystalline silicon containing impurities such as phosphorus (P) or boron (B). Further, the insulating layer 101 such as silicon oxide ($SiO_2$) is provided between the semiconductor layer 112 and the conductive layer 110.

The semiconductor layer 112 functions as a source line SL (FIG. 5). The source line SL is provided in common for all the memory blocks BLK provided in the memory cell array MCA, for example.

As shown in FIG. 6, for example, the semiconductor columns 120 are located in a predetermined pattern in the X direction and the Y direction. The semiconductor column 120 functions as a channel region of a plurality of memory cells MC and select transistors (STD, STS, and STSb) provided in one memory string MS (FIG. 5). The semiconductor column 120 is, for example, a semiconductor layer such as polycrystalline silicon (Si). As shown in FIG. 6, for example, the semiconductor column 120 has a substantially bottomed cylindrical shape, and an insulating layer 125 such as silicon oxide is provided in the central portion thereof. Further, the outer peripheral surfaces of the semiconductor columns 120 are each surrounded by the conductive layer 110 and face the conductive layer 110.

An impurity region 121 containing N-type impurities such as phosphorus (P) is provided at the upper end portion of the semiconductor column 120. The impurity region 121 is connected to the bit line BL via the contact Ch and the contact Cb.

The gate insulating film 130 has a substantially bottomed cylindrical shape that covers the outer peripheral surface of the semiconductor column 120. The gate insulating film 130 includes, for example, a tunnel insulating film, a charge storage film, and a block insulating film stacked between the semiconductor column 120 and the conductive layer 110. The tunnel insulating film and the block insulating film are, for example, an insulating film such as silicon oxide ($SiO_2$) The charge storage film is, for example, a film capable of storing charges such as silicon nitride ($Si_3N_4$). The tunnel insulating film, the charge storage film, and the block insulating film have a substantially cylindrical shape and extend in the Z direction along the outer peripheral surface of the semiconductor column 120 excluding the contact portion between the semiconductor column 120 and the semiconductor layer 112.

The gate insulating film 130 may include, for example, a floating gate such as polycrystalline silicon containing N-type or P-type impurities.

A plurality of contacts CC are provided at the end portions of the plurality of conductive layers 110 in the X direction. The plurality of conductive layers 110 are connected to the peripheral circuit PC via the plurality of contacts CC. As shown in FIG. 6, the plurality of contacts CC extend in the Z direction and are connected to the conductive layer 110 at the lower end. The contact CC may include, for example, a barrier conductive film such as titanium nitride (TiN) and a stacked film of a metal film such as tungsten (W).

[Configuration of Peripheral Circuit PC]

As shown in FIG. 4, for example, the peripheral circuit PC includes row decoders RD0 and RD1 connected to memory cell arrays MCA0 and MCA1, respectively, and sense amplifiers SA0 and SA1. Further, the peripheral circuit PC includes a voltage generation circuit VG and a sequencer SQC. Further, the peripheral circuit PC includes an input and output control circuit I/O, a logic circuit CTR, an address register ADR, a command register CMR, a status register STR, and a data output timing adjustment unit TCT. In the following description, the row decoders RD0 and RD1 may be referred to as a row decoder RD, and the sense amplifiers SA0 and SA1 may be referred to as a sense amplifier SA.

[Configuration of Row Decoder RD]

As shown in FIG. 5, for example, the row decoder RD (FIG. 4) includes an address decoder 22 that decodes the address data Add (FIG. 4), and a block selection circuit 23 and a voltage selection circuit 24 for transferring the operating voltage to the memory cell array MCA according to the output signal of the address decoder 22.

The address decoder 22 includes a plurality of block selection lines BLKSEL and a plurality of voltage selection lines 33. For example, the address decoder 22 retrieves the row address RA from the address register ADR (FIG. 4) according to the control signal from the sequencer SQC, decodes the row address RA, and sets a predetermined block select transistor 35 corresponding to the row address RA and the voltage select transistor 37 are turned on, and the other block select transistors 35 and the voltage select transistor 37 are turned off. For example, the voltage of the predetermined block selection line BLKSEL and the voltage selection line 33 is set to the "H" state, and the other voltages are set to the "L" state. When a P-channel type transistor is used instead of an N-channel type transistor, a reverse voltage is applied to these wirings.

In the illustrated example, the address decoder 22 is provided with one block selection line BLKSEL for each memory block BLK. However, this configuration may be changed as appropriate. For example, one block selection line BLKSEL may be provided for each group of two or more memory blocks BLK.

The block selection circuit 23 includes a plurality of block selection units 34 corresponding to the memory block BLK. Each of the plurality of block selection units 34 includes a plurality of block select transistors 35 corresponding to the word line WL and the select gate lines (SGD, SGS, and SGSb). The block select transistor 35 is, for example, a field effect type withstand voltage transistor. The drain electrode of the block select transistor 35 is electrically connected to the corresponding word line WL or select gate line (SGD, SGS, or SGSb), respectively. The source electrodes are electrically connected to the voltage supply line 31 via the wiring CG and the voltage selection circuit 24, respectively. The gate electrode is commonly connected to the corresponding block selection line BLKSEL.

The block selection circuit 23 further includes a plurality of transistors (not shown). The plurality of transistors are field effect type high-breakdown voltage transistors connected between the select gate lines (SGD, SGS, and SGSb) and the voltage supply line to which the ground voltage Vss is supplied. The plurality of transistors supply the ground voltage Vss to the select gate lines (SGD, SGS, and SGSb) provided in the non-selected memory block BLK. The plurality of word lines WL provided in the non-selected memory block BLK are in a floating state.

The voltage selection circuit 24 includes a plurality of voltage selection units 36 corresponding to the word line WL and the select gate lines (SGD, SGS, and SGSb). Each of the plurality of voltage selection units 36 includes a plurality of voltage select transistors 37. The voltage select transistor 37 is, for example, a field effect type high-breakdown voltage transistor. The drain terminal of the voltage select transistor 37 is electrically connected to the corresponding word line WL or select gate line (SGD, SGS, or SGSb) via the wiring CG and the block selection circuit 23, respectively. Each source terminal is electrically connected to the corresponding voltage supply line 31. Each gate electrode is connected to the corresponding voltage selection line 33.

[Configuration of Sense Amplifier SA]

The sense amplifiers SA0 and SA1 (FIG. 4) include sense amplifier modules SAM0 and SAM1 and cache memories CM0 and CM1 (which are implemented as data registers in the embodiments), respectively. The cache memories CM0 and CM1 include latch circuits XDL0 and XDL1, respectively.

In the following description, the sense amplifier modules SAM0 and SAM1 may be referred to as a sense amplifier module SAM, the cache memories CM0 and CM1 may be referred to as a cache memory CM, and the latch circuits XDL0 and XDL1 may be referred to as a latch circuit XDL.

The sense amplifier module SAM includes, for example, a sense circuit corresponding to each of a plurality of bit lines BL, a plurality of latch circuits connected to the sense circuit, and the like.

The cache memory CM includes a plurality of latch circuits XDL. Each of the plurality of latch circuits XDL is connected to the latch circuit in the sense amplifier module SAM. In the latch circuit XDL, for example, the user data Dat written in the memory cell MC or the user data Dat read from the memory cell MC is stored.

A column decoder COLD is connected to the cache memory CM, for example, as shown in FIG. 7. The column decoder COLD decodes the column address CA stored in the address register ADR (FIG. 4) and selects the latch circuit XDL corresponding to the column address CA.

The user data Dat provided in the plurality of latch circuits XDL is sequentially transmitted to the latch circuit in the sense amplifier module SAM during the writing operation. Further, the user data Dat provided in the latch circuit in the sense amplifier module SAM is sequentially transmitted to the latch circuit XDL during the read operation. Further, the user data Dat provided in the latch circuit XDL is sequentially transmitted to the input and output control circuit I/O via the column decoder COLD and the multiplexer MPX at the time of the data-out operation described later.

[Configuration of Voltage Generation Circuit VG]

The voltage generation circuit VG (FIG. 4) is connected to a plurality of voltage supply lines 31 as shown in FIG. 5, for example. The voltage generation circuit VG includes, for example, a step-down circuit such as a regulator and a step-up circuit such as a charge pump circuit 32. These step-down circuit and step-up circuit are connected to a voltage supply line to which a power supply voltage $V_{CC}$ and a ground voltage Vss (FIG. 4) are supplied, respectively. These voltage supply lines are connected to, for example, the pad electrodes P described with reference to FIGS. 2A, 2B, and 3. The voltage generation circuit VG, for example, according to a control signal from the sequencer SQC, generates a plurality of operating voltages applied to a bit line BL, a source line SL, a word line WL, and select gate lines (SGD, SGS, and SGSb) in a read operation, a write operation, and an erasing operation for the memory cell array MCA, and outputs the operating voltages to a plurality of voltage supply lines 31 at the same time. The operating voltage output from the voltage supply line 31 is appropriately adjusted according to the control signal from the sequencer SQC.

[Configuration of Sequencer SQC]

The sequencer SQC (FIG. 4) outputs an internal control number to the row decoders RD0 and RD1, the sense amplifier modules SAM0 and SAM1, and the voltage generation circuit VG according to the command data Cmd stored in the command register CMR. Further, the sequencer SQC outputs the status data Stt indicating the state of the memory die MD to the status register STR as appropriate.

Further, the sequencer SQC generates a ready and busy signal and outputs the signal to the terminal RY//BY. The terminal RY//BY is in the "L" state during the execution of an operation which involves supply of a voltage to the memory cell array MCA, such as a read operation, a write operation, and an erasing operation and is in an "H" state in other cases. On the other hand, when an operation which does not involve supply of a voltage to the memory cell array MCA, such as a data-out operation and status read, which will be described later, is executed, the terminal RY//BY does not enter the "L" state. During the period (busy period) in which the terminal RY//BY is in the "L" state, access to the memory die MD is basically prohibited. Further, during the period (ready period) in which the terminal RY//BY is in the "H" state, access to the memory die MD is permitted. The terminal RY//BY is implemented by, for example, the pad electrodes P described with reference to FIGS. 2A, 2B, and 3.

Further, the sequencer SQC includes a feature register FR. The feature register FR is a register that holds the feature data Fd. The feature data Fd includes, for example, control parameters of the memory die MD. The feature data Fd may include, for example, a value indicating which mode between the operation mode MODEa and the operation mode MODEb, which will be described later, is used to operate the memory die MD.

[Configuration of Address Register ADR]

As shown in FIG. 4, the address register ADR is connected to the input and output control circuit I/O and stores the address data Add input from the input and output control circuit I/O. The address register ADR includes, for example, a plurality of 8-bit register sequences. The register sequence stores the address data Add corresponding to the internal operation being executed when the internal operation such as a read operation, a write operation, or an erasing operation is executed.

The address data Add includes, for example, a column address CA (FIG. 4) and a row address RA (FIG. 4). The row address RA includes, for example, a block address for specifying the memory block BLK (FIG. 5), a page address for specifying the string unit SU and the word line WL, a plane address for specifying the memory cell array MCA (plane), and a chip address for specifying the memory die MD.

[Configuration of Command Register CMR]

The command register CMR is connected to the input and output control circuit I/O and stores the command data Cmd input from the input and output control circuit I/O. The command register CMR includes, for example, at least one set of 8-bit register sequences. When the command data Cmd is stored in the command register CMR, a control signal is transmitted to the sequencer SQC.

[Configuration of Status Register SIR]

The status register STR is connected to the input and output control circuit I/O and stores the status data Stt to be output to the input and output control circuit I/O. The status register STR includes, for example, a plurality of 8-bit register sequences. The register sequence stores status data Stt related to the internal operation being executed when an internal operation such as a read operation, a write operation, or an erasing operation is executed. Further, the register sequence includes, for example, ready and busy information of the memory cell arrays MCA0 and MCA1.

[Configuration of Data Output Timing Adjustment Unit TCT]

The data output timing adjustment unit TCT is connected to a bus DB between the cache memories CM0 and CM1 and the input and output control circuit I/O. The data output timing adjustment unit TCT adjusts the start timing of the data-out operation with respect to the cache memory CM1 in order to start the data-out operation of the cache memory CM1 without introducing any time delay after the data-out operation of the cache memory CM0 is completed, for example, when the data-out operation described later is continuously executed with respect to the cache memories CM0 and CM1.

[Configuration of Input and Output Control Circuit I/O]

The input and output control circuit I/O (FIG. 4) includes data signal input and output terminals DQ0 to DQ7, data strobe signal input and output terminals DQS and /DQS, a shift register (not shown), a buffer circuit (not shown), and a connection change circuit SW.

Each of the data signal input and output terminals DQ0 to DQ7 and the data strobe signal input and output terminals DQS and /DQS is implemented by, for example, the pad electrodes P described with reference to FIGS. 2A, 2B, and 3. The data input via the data signal input and output terminals DQ0 to DQ7 is input from the buffer circuit to the cache memory CM, the address register ADR, or the command register CMR according to the internal control signal from the logic circuit CTR. Further, the data output via the data signal input and output terminals DQ0 to DQ7 is input to the buffer circuit from the cache memory CM or the status register STR according to the internal control signal from the logic circuit CTR.

The signal input via the data strobe signal input and output terminals DQS and /DQS (for example, the data strobe signal and the complementary signal thereof) is used when inputting data via the data signal input and output terminals DQ0 to DQ7. The data input via the data signal input and output terminals DQ0 to DQ7 is received into the shift register in the input and output control circuit I/O at the timing of the rising edge of the voltage of the data strobe signal input and output terminal DQS and the falling edge of the voltage of the data strobe signal input and output terminal /DQS, and at the timing of the falling edge of the voltage of the data strobe signal input and output terminal DQS and the rising edge of the voltage of the data strobe signal input and output terminal /DQS.

Each of the data signal input and output terminals DQ0 to DQ7 and the data strobe signal input and output terminals DQS and /DQS are connected to an input circuit 201 and an output circuit 202, for example, as shown in FIG. 8. The input circuit 201 is, for example, a receiver such as a comparator. The output circuit 202 is, for example, a driver such as an OCD (Off Chip Driver) circuit.

The connection change circuit SW is a circuit that changes the order of data input to the data signal input and output terminals DQ0 to DQ7 from the outside of the memory die MD. More specifically, for example, when the command data Cmd or the address data Add is input to the data signal input and output terminals DQ0 to DQ7 of the memory die MD provided in the reverse connection package PKGb, the connection change circuit SW changes the order of data of the command data Cmd or the address data Add and the data received into the command register CMR or the address register ADR. On the other hand, when the command data Cmd or the address data Add is input to the data signal input and output terminals DQ0 to DQ7 of the memory die MD provided in the normal connection package PKGa, the data is received into the command register CMR or the address register ADR without the change in the order of data by the connection change circuit SW. The connection change circuit SW may be configured to change the data order even when the feature data Fd is input to the data signal input and output terminals DQ0 to DQ7 of the memory die MD provided in the reverse connection package PKGb. Further, the connection change circuit SW may be configured to change the data order and output the data to the data signal input and output terminals DQ0 to DQ7 when the feature data Fd or the status data Stt is output from the memory die MD provided in the reverse connection package PKGb.

For example, in the connection mode shown in FIG. 3, when the controller die CD outputs the command data Cmd corresponding to "70h" (01110000), a signal corresponding to "70h" (01110000) is input to the data signal input and output terminals DQ0 to DQ7 of the memory die MD provided in the normal connection package PKGa, and a signal corresponding to "8Fh" (10001111) is input to the data signal input and output terminals DQ0 to DQ7 of the memory die MD provided in the reverse connection package PKGb. Then, the data corresponding to "70h" (01110000) is stored as it is in the command register CMR of the memory die MD provided in the normal connection package PKGa, and the data corresponding to "70h" (01110000) is stored in the command register CMR of the memory die MD provided in the reverse connection package PKGb via the connection change circuit SW.

Each memory die MD determines, for example, whether it is provided in the normal connection package PKGa or in the reverse connection package PKGb based on the feature data Fd stored in the feature register FR.

[Configuration of Logic Circuit CTR]

The logic circuit CTR (FIG. 4) includes a plurality of external control terminals /CE, CLE, ALE, /WE, /RE, RE, and /WP and a logic circuit connected to the plurality of external control terminals /CE, CLE, ALE, /WE, /RE, RE, and /WP. The logic circuit CTR receives an external control signal from the controller die CD via the external control terminal /CE, CLE, ALE, /WE, /RE, RE, and /WP, and the internal control signal is output to the input and output control circuit I/O accordingly.

Each of the external control terminals /CE, CLE, ALE, /WE, /RE, RE, and /WP is connected to the input circuit 201, for example, as shown in FIG. 8. Further, each of the external control terminals CLE, ALE, and /WP is connected to the output circuit 202 in addition to the input circuit 201. Each of the external control terminals /CE, CLE, ALE, /WE, /RE, RE, and /WP is implemented by, for example, the pad electrodes P described with reference to FIGS. 2A, 2B, and 3.

The signal input via the external control terminal /CE (for example, the chip enable signal) is used when selecting the memory die MD. The memory die MD in which "L" is input to the external control terminal /CE is in a state where the user data Dat, command data Cmd, address data Add, and status data Stt (hereinafter, may be simply referred to as "data") can be input and output. The memory die MD in which "H" is input to the external control terminal /CE is in a state where data input and output are disenabled. As shown in FIG. 8, the external control terminal /CE is connected to the input circuit 201.

The signal input via the external control terminal CLE (for example, the command latch enable signal) is used when using the command register CMR or the like. Further, in the present embodiment, the signal input via the external control terminal CLE is used when the command register CMR is used, and is also used as the command data Cmd and the address data Add. Further, the status data Stt is output from the status register STR via the external control terminal CLE. The functions of the external control terminal CLE and the like will be described later.

The signal input via the external control terminal ALE (for example, the address latch enable signal) is used when using the address register ADR or the like. Further, in the present embodiment, the signal input via the external control terminal ALE is used when the address register ADR is used, and is also used as the command data Cmd and the address data Add. Further, the status data Stt is output from the status register STR via the external control terminal ALE. The functions of the external control terminal ALE will be described later.

The signal input via the external control terminal /WE (for example, a write enable signal) is used when data is input from the controller die CD to the memory die MD. The functions of the external control terminal /WE will be described later.

The signal input via the external control terminals /RE and RE (for example, the read enable signal and the complementary signal thereof) is used when outputting data via the data signal input and output terminals DQ0 to DQ7. The data output from the data signal input and output terminals DQ0 to DQ7 is switched at the timing of the falling edge of the voltage of the external control terminal /RE and the rising edge of the voltage of the external control terminal RE, and at the timing of the rising edge of the voltage of the external control terminal /RE and the falling edge of the voltage of the external control terminal RE.

The signal (for example, write protect signal) input via the external control terminal /WP is used when inputting the command data Cmd and the address data Add from the controller die CD to the memory die MD. In this embodiment, the signal input via the external control terminal /WP may be used for not only inputting the command data Cmd and the address data Add, but also for outputting the status data Stt from the status register STR.

[Operation Mode MODEa and Operation Mode MODEb]

The semiconductor storage device according to the present embodiment can be operated in the operation mode MODEa and the operation mode MODEb. Hereinafter, the operation mode MODEa and the operation mode MODEb will be described with reference to FIGS. 9 to 19.

[Role of External Terminal in Each Mode]

Figure 9:
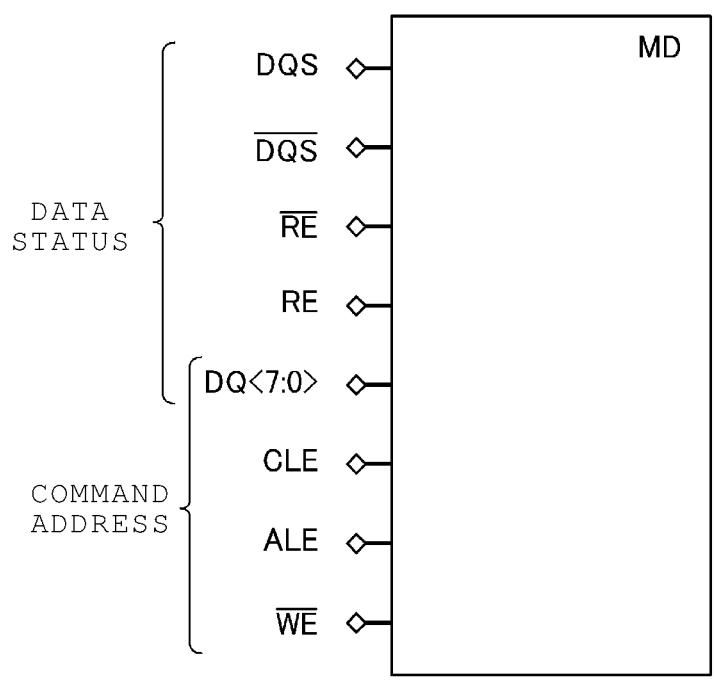
FIG. 9 is a schematic diagram illustrating an operation mode MODEa.
Figure 10:
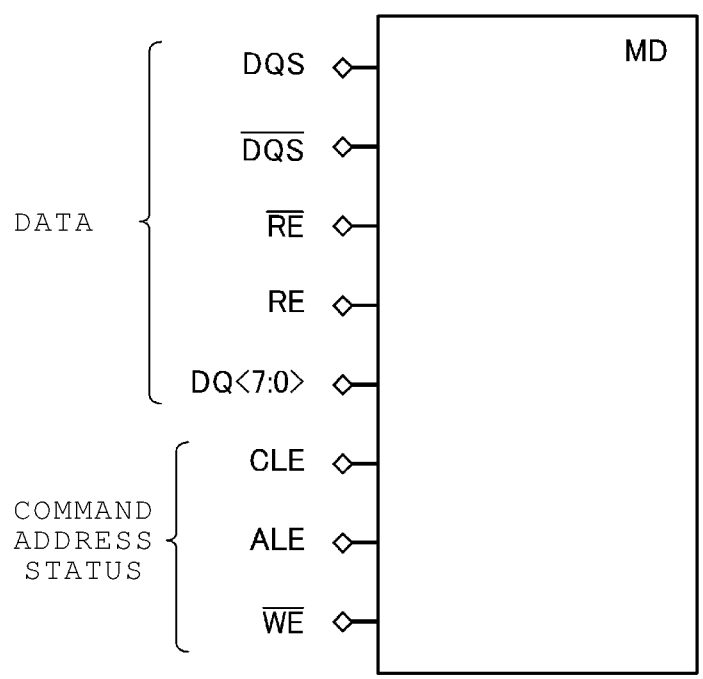
FIG. 10 is a schematic diagram illustrating an operation mode MODEb.

FIG. 9 is a schematic diagram illustrating the roles of the signal input and output terminal and the external control terminal when the memory die MD is set to the operation mode MODEa. FIG. 10 is a schematic diagram illustrating the roles of the signal input and output terminal and the external control terminal when the memory die MD is set to the operation mode MODEb. In the following description, the data signal input and output terminals DQ0 to DQ7 may be referred to as data signal input and output terminals DQ<7:0>.

In the operation mode MODEa, for example, as shown in FIG. 9, the data signal input and output terminals DQ<7:0> are used in the input of command data Cmd and address data Add in addition to the input and output of user data Dat and the output of status data Stt.

On the other hand, in the operation mode MODEb, for example, as shown in FIG. 10, the data signal input and output terminals DQ<7:0> are used in the input and output of user data Dat, but are not used in the input of command data Cmd and address data Add, and the output of status data Stt. In the operation mode MODEb, the external control terminals CLE and ALE are used in the input of command data Cmd and address data Add, and the output of status data Stt.

[Role of External Terminal in Operation Mode MODEa]

FIG. 11 is a truth table illustrating the role of the external terminals when the memory die MD is set to the operation mode MODEa. In FIG. 11, "Z" indicates a case where either "H" or "L" may be input. "X" indicates a case where the input signal is fixed to "H" or "L". "Input" indicates a case where data is input. "Output" indicates a case where data is output.

When the command data Cmd is input in the operation mode MODEa, the controller die CD, for example, sets the voltages of the data signal input and output terminals DQ<7:0> to "H" or "L" according to each bit of the 8-bit command data Cmd, inputs "H" to the external control terminal CLE, and inputs "L" to the external control terminal ALE, and then raises the voltage of the external control terminal /WE from "L" to "H" (more specifically, lowers the voltage of the external control terminal /WE from "H" to "L" and thereafter raises the voltage of the external control terminal /WE from "L" to "H").

When "H and L" are input to the external control terminals CLE and ALE, the data input via the data signal input and output terminals DQ<7:0> is stored in the buffer memory in the input and output control circuit I/O as command data Cmd and transmitted to the command register CMR (FIG. 4).

When the address data Add is input, the controller die CD, for example, sets the voltages of the data signal input and output terminals DQ<7:0> to "H" or "L" according to each bit of the 8-bit data including the address data Add, inputs "L" to the external control terminal CLE, and inputs "H" to the external control terminal ALE, and then raises the external control terminal /WE from "L" to "H".

When "L and H" are input to the external control terminals CLE and ALE, the data input via the data signal input and output terminals DQ<7:0> is stored in the buffer memory in the input and output control circuit I/O as the address data Add and transmitted to the address register ADR (FIG. 4).

When the user data Dat is input, the controller die CD, for example, sets the voltages of the data signal input and output terminals DQ<7:0> to "H" or "L" according to each bit of the 8-bit data including the user data Dat, inputs "L" to the external control terminal CLE, inputs "L" to the external control terminal ALE, and then switches (toggles) the input signal of the data strobe signal input and output terminals DQS and /DQS.

When "L" is input to both the external control terminals CLE and ALE, the data input via the data signal input and output terminals DQ<7:0> is stored in the buffer memory in the input and output control circuit I/O as user data Dat and transmitted to the cache memory CM (FIG. 4) via the bus DB.

Also, when outputting user data Dat, the controller die CD switches (toggles), for example, the input signals of the external control terminals /RE and RE. Along with this, 8 bits of the output user data Dat are output to the data signal input and output terminals DQ0 to DQ7. Further, the output signals of the data strobe signal input and output terminals DQS and /DQS are switched.

When the memory die MD is set to the standby state, the controller die CD inputs, for example, "H" to the external control terminal /CE.

When the memory die MD is set to the bus idle state, the controller die CD inputs, for example, "H" to the external control terminal /WE.

[Role of External Terminal in Operation Mode MODEb]

FIGS. 12 and 13 are truth tables illustrating the role of the external terminal when the memory die MD is set to the operation mode MODEb. In addition, in FIGS. 12 and 13, "Z" indicates a case where either "H" or "L" may be input. "X" indicates a case where the input signal is fixed to "H" or "L". "Input" indicates a case where data is input. "Output" indicates a case where data is output.

As described above, in the operation mode MODEb, the external control terminals CLE and ALE are used in the input of command data and address data, and also used in the output of status data Stt. Here, as will be described later with reference to FIG. 15, when the command data Cmd or the address data Add is input in the operation mode MODEb, the controller die CD inputs a signal indicating whether the data to be input next is the command data Cmd or the address data Add to the memory die MD. Hereinafter, such a signal is referred to as an input and output data selection signal. In the operation mode MODEb, the input and output data selection signal may be referred to as a header, and the command data Cmd, address data Add, status data Stt, and the like that are input and output following the input and output data selection signal may be referred to as a body. Further, a combination of one header and one body may be called a frame. Further, the input and output data selection signal may be referred to as a frame selection signal.

FIG. 12 shows the role of the external control terminals in the period FSel (FIG. 15) at which the input and output data selection signal is input. FIG. 13 shows the role of the external control terminals in the period S_In (FIG. 15) or the period S_Out (FIG. 18B) after the input and output data selection signal is input.

When inputting an input and output data selection signal to input command data Cmd in the period FSel, for example, the controller die CD inputs "H" to the external control terminal CLE, inputs "L" to the external control terminal ALE, and then raises the external control terminal /WE from "L" to "H".

When "H" is input to the external control terminal CLE and "L" is input to the external control terminal ALE in the period FSel, the data input to the period S_In immediately after this period FSel is stored in the buffer memory in the input and output control circuit I/O as command data Cmd and transmitted to the command register CMR (FIG. 4).

Further, in the period FSel, when the input and output data selection signal for inputting the address data Add is input, the controller die CD inputs, for example, "L" to the external control terminal CLE, inputs "H" to the external control terminal ALE, and then raises the external control terminal /WE from "L" to "H".

When "L" is input to the external control terminal CLE and "H" is input to the external control terminal ALE in the period FSel, the data input to the period S_In immediately after this period FSel is stored in the buffer memory in the input and output control circuit I/O as the address data Add and transmitted to the address register ADR (FIG. 4).

When the command data Cmd or the address data Add is input in the period S_In, the controller die CD sets, for example, the voltages of the external control terminals CLE and ALE to "H" or "L" according to each bit of the 2-bit data including the command data Cmd or the address data Add and raises the external control terminal /WE from "L" to "H".

When the user data Dat is input in the operation mode MODEb, the controller die CD, for example, sets the voltages of the data signal input and output terminals DQ<7:0> to "H" or "L" according to each bit of the 8-bit data including the user data Dat, inputs "H and L" to the external control terminals /RE and RE, respectively, and then switches the input signals of the data strobe signal input and output terminals DQS and /DQS. This operation can be performed in both the period FSel and the period S_In.

In the operation mode MODEb, the data input via the data signal input and output terminals DQ<7:0> is stored in the buffer memory in the input and output control circuit I/O as user data Dat and transmitted to the cache memory CM via the bus DB.

When inputting an input and output data selection signal to output status data Stt in the period FSel, for example, the controller die CD inputs "L" to the external control terminal CLE, inputs "L" to the external control terminal ALE, and then raises the external control terminal /WE from "L" to "H".

When "L" is input to the external control terminal CLE and "L" is input to the external control terminal ALE in the period FSel, and when the status data Stt is output in the period S_Out immediately after this period FSel, the controller die CD lowers, for example, the input signal of the external control terminal /WE (FIG. 13). Along with this, 2 bits of the status data Stt are output from the external control terminals CLE and ALE to the controller die CD by the output circuit 202.

When the memory die MD is set to the standby state, the controller die CD inputs, for example, "H" to the external control terminal /CE.

When the memory die MD is set to the bus idle state, the controller die CD inputs, for example, "H" to the external control terminal /WE.

[Example of Signal Input and Output in Each Mode]

Figure 14:
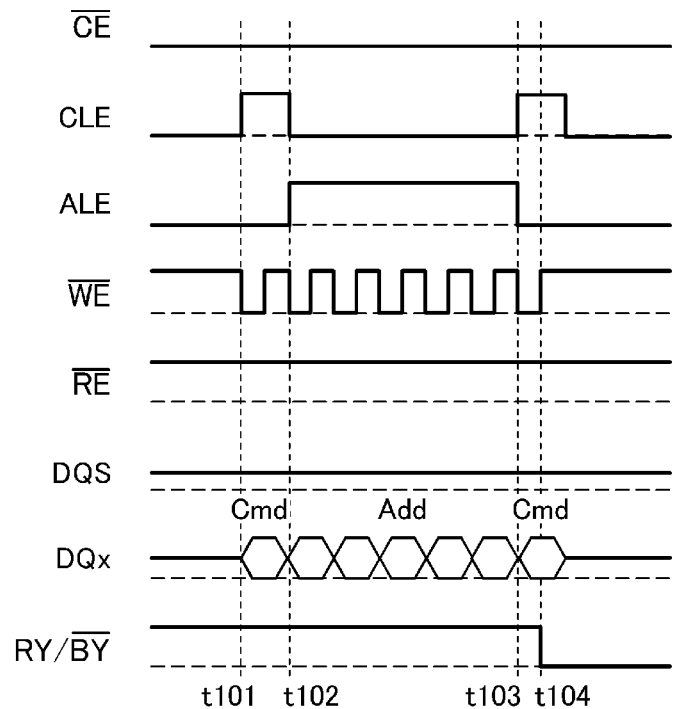
FIG. 14 is a schematic waveform diagram illustrating the operation mode MODEa.
Figure 15:
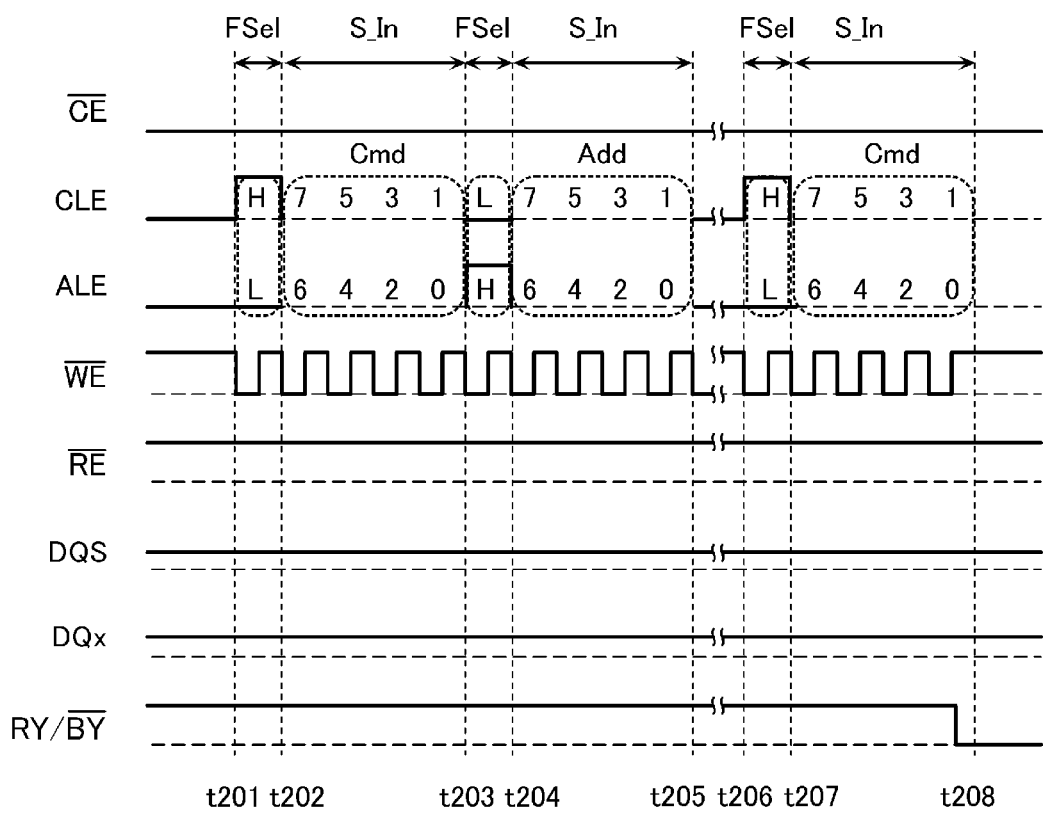
FIG. 15 is a schematic waveform diagram illustrating the operation mode MODEb.

FIGS. 14 and 15 are schematic waveform diagrams illustrating the operation of the memory die MD according to the first embodiment.

FIG. 14 shows a waveform when the command data Cmd and the address data Add are input when the memory die MD is set to the operation mode MODEa. In the example of FIG. 14, at the timing t101, the controller die CD inputs the command data Cmd to the memory die MD. Further, at the timing t102, the controller die CD inputs the address data Add to the memory die MD. In the illustrated example, data of 8 bits×5 cycles including the address data Add is input from the timing t102 to t103, but the number of cycles may be less than or more than 5. Further, at the timing t103, the controller die CD inputs the command data Cmd to the memory die MD. Further, at the timing t104, an operation such as a read operation is started and the voltage of the terminal RY//BY drops from "H" to "L".

FIG. 15 shows a waveform when the command data Cmd and the address data Add are input when the memory die MD is set to the operation mode MODEb. In the example of FIG. 15, "L" and "H" are input to the external control terminal /WE at a substantially constant frequency. Further, the period from when the input signal of the external control terminal /WE drops once to when the input signal drops again at a predetermined timing is shown as the above-mentioned period FSel. Further, the period from when the input signal of the external control terminal /WE drops at the end of the period FSel to when the input signal of the external control terminal /WE drops four more times is shown as the above-mentioned period S_In.

In the example of FIG. 15, in the period FSel from the timing t201 to t202, the controller die CD inputs the input and output data selection signal for designating the input of the command data Cmd to the memory die MD.

Further, during the period S_In from the timing t202 to t203, the controller die CD inputs the command data Cmd to the memory die MD.

Here, in the example of FIG. 15, in the period S_In, the controller die CD inputs the 8-bit command data Cmd to the memory die MD in 4 cycles of 2 bits each. For example, the 8-bit command data Cmd is set to bits "7" to "0". First, in the data input of the first cycle, the external control terminal /WE is raised from "L" to "H" in the state where the voltages of the external control terminals CLE and ALE are set to "H" or "L" according to the bits "7" and "6". Similarly, in the data input of the second cycle to the fourth cycle, the external control terminal /WE is raised from "L" to "H" in the state where the voltages of the external control terminals CLE and ALE are set to "H" or "L" according to the bits "5" and "4", the bits "3" and "2", and the bits "1" and "0", respectively.

Further, in the period FSel of the timing t203 to t204, the controller die CD inputs the input and output data selection signal for designating the input of the address data Add to the memory die MD.

Further, during the period S_In from the timing t204 to t205, the controller die CD inputs the address data Add to the memory die MD.

Here, in the example of FIG. 15, in the period S_In, the controller die CD inputs the 8-bit data including the address data Add to the memory die MD in 4 cycles of 2 bits each.

Although not shown, 2 bits of the data including the address data Add is similarly input between the timings t205 and t206.

Further, in the period FSel from the timing t206 to t207, the input and output data selection signal for designating the input of the command data Cmd is input as in the period from the timing t201 to t202.

Further, in the period S_In from the timing t207 to t208, the controller die CD inputs the command data Cmd to the memory die MD. Further, at the timing when the external control terminal /WE finally rises from "L" to "H" in the period S_In, operations such as a read operation are started, and the voltage of the terminal RY//BY drops from "H" to "L".

In the period FSel, when the controller die CD inputs the input and output data selection signal for designating the input of the command data Cmd or the address data Add to the memory die MD, the period immediately after that is the period S_In, but when the controller die CD inputs the input and output data selection signal for outputting the status data Stt to the memory die MD in the period FSel, the period immediately after that is the period S_Out, as will be described later.

[Operation]

Next, the operation of the memory die MD will be described.

The memory die MD is configured to be able to execute a read operation. The read operation is an operation of reading the user data Dat from the memory cell array MCA by the sense amplifier module SAM and transmitting the read user data Dat to the latch circuit XDL. In the read operation, the user data Dat read from the memory cell array MCA is transmitted to the latch circuit XDL via the bit line BL and the sense amplifier module SAM.

In addition, the memory die MD is configured to be able to execute a data-out operation. The data-out operation is an operation of outputting the user data Dat provided in the latch circuit XDL to the controller die CD. In the data-out operation, the user data Dat provided in the latch circuit XDL is output to the controller die CD via the column decoder COLD, the multiplexer MPX, the bus DB, and the input and output control circuit I/O described with reference to FIG. 7.

In addition, the memory die MD is configured to be able to execute status read. The status read is an operation of outputting the status data Stt provided in the status register STR to the controller die CD. In the status read, the status data Stt provided in the status register STR is output to the controller die CD via the input and output control circuit I/O or the logic circuit CTR.

[Read Operation and Data-Out Operation in Operation Mode MODEa]

Figure 16:
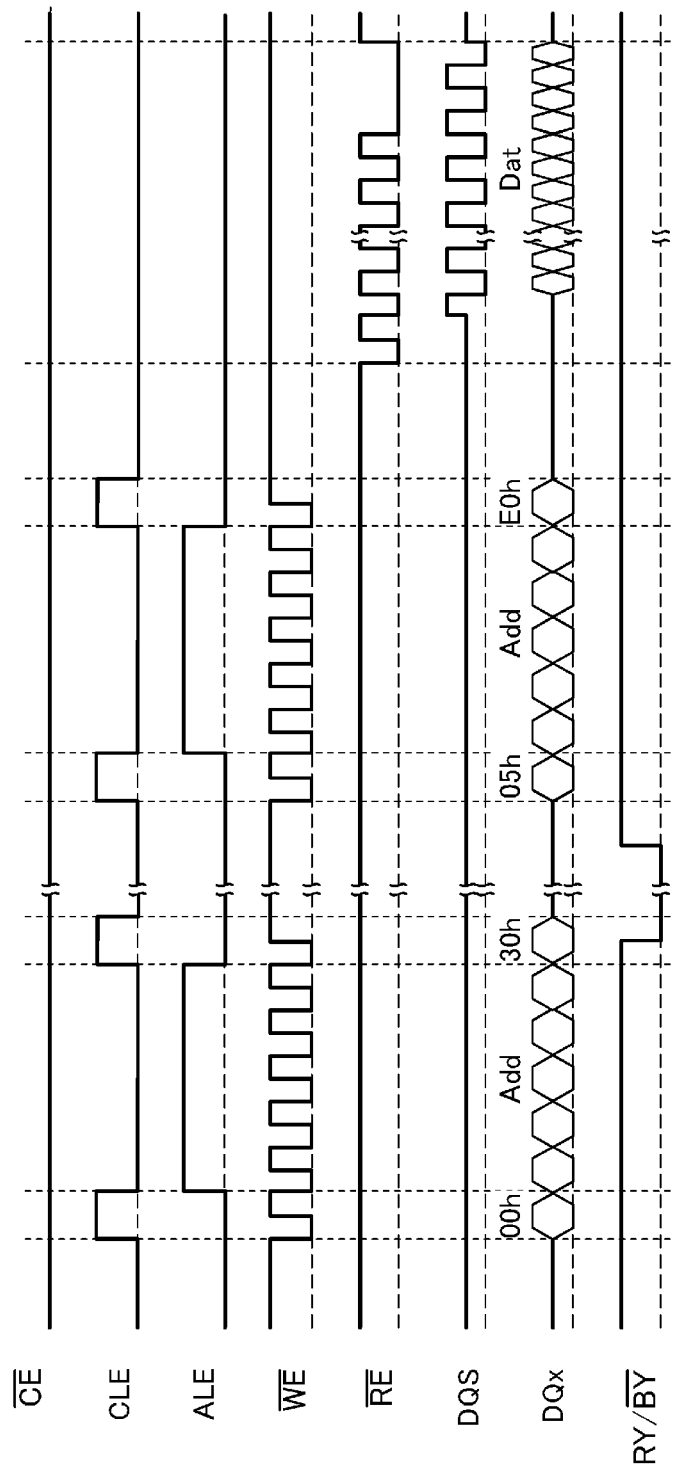
FIG. 16 is a schematic timing chart illustrating the operation mode MODEa.

FIG. 16 is a schematic timing chart showing a state in which a read operation and a data-out operation are executed in the operation mode MODEa. In the example of FIG. 16, the memory die MD is set to the operation mode MODEa.

In the example of FIG. 16, first, the command data "00h", the address data Add, and the command data "30h" are sequentially input via the data signal input and output terminals DQ<7:0>. The command data "00h" is the command data Cmd input at the beginning of the command set instructing the read operation. The command data "30h" is the command data Cmd to be input at the end of the command set instructing the read operation.

With the input of the command data "00h", the address data Add, and the command data "30h", the read operation is started, and the voltage of the terminal RY//BY drops from "H" to "L". Further, the user data Dat is transmitted to the latch circuit XDL. Further, at the timing when the read operation is completed, the voltage of the terminal RY//BY rises from "L" to "H".

Next, the command data "05h", the address data Add, and the command data "E0h" are sequentially input via the data signal input and output terminals DQ<7:0>. The command data "05h" is the command data Cmd input at the beginning of the command set instructing the data-out operation. The command data "E0h" is the command data Cmd to be input at the end of the command set instructing the data-out operation.

Along with the input of the command data "05h", the address data Add, and the command data "E0h", the controller die CD switches (toggles) the input signals of the external control terminals /RE and RE after a predetermined standby time. As a result, the data-out operation is started, and the user data Dat is output via the data signal input and output terminal DQ.

Figure 17:
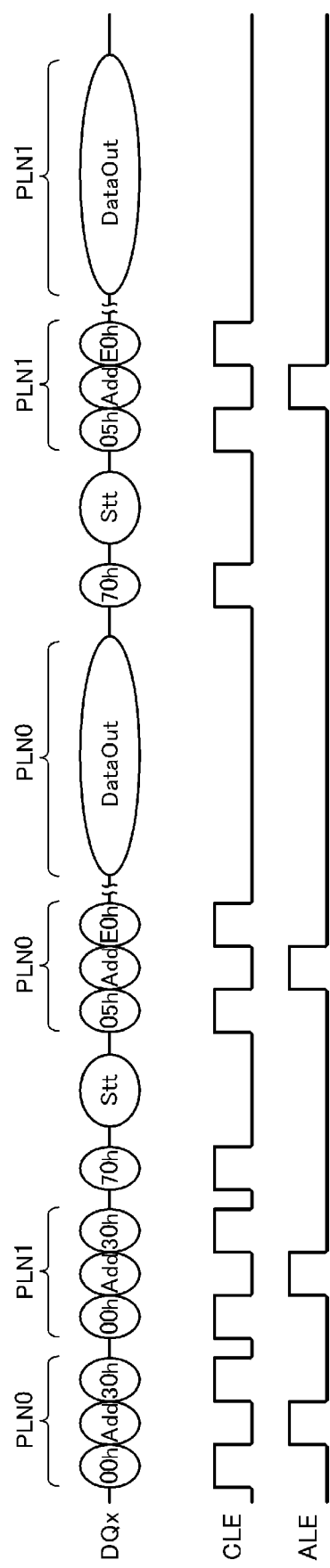
FIG. 17 is a schematic timing chart illustrating the operation mode MODEa.

FIG. 17 is a schematic timing chart showing another state when the read operation and the data-out operation are executed in the operation mode MODEa. In the example of FIG. 17, the memory die MD is set to the operation mode MODEa.

In the example of FIG. 17, first, the command data "00h", the address data Add, and the command data "30h" are sequentially input via the data signal input and output terminals DQ<7:0>. The address data Add provided in this command set includes the information of the plane PLN0 (FIG. 4) to be read out as the plane address.

With the input of the command data "00h", the address data Add, and the command data "30h", the read operation is started for the plane PLN0, and the user data Dat is transmitted to the latch circuit XDL0.

Next, the command data "00h", the address data Add, and the command data "30h" are sequentially input via the data signal input and output terminals DQ<7:0>. The address data Add provided in this command set includes the information of the plane PLN1 (FIG. 4) to be read out as the plane address.

With the input of the command data "00h", the address data Add, and the command data "30h", the read operation is started for the plane PLN1, and the user data Dat is transmitted to the latch circuit XDL1.

Next, the command data "70h" is input via the data signal input and output terminals DQ<7:0>. The command data "70h" is command data instructing the status read. Along with the input of the command data "70h", the status read is performed, and the status data Stt is output via the data signal input and output terminals DQ<7:0>.

Next, the command data "05h", the address data Add, and the command data "E0h" are sequentially input via the data signal input and output terminals DQ<7:0>. The address data Add provided in this command set includes information of the plane PLN0 (FIG. 4) that is the target of the data-out operation as the plane address.

Along with the input of the command data "05h", the address data Add, and the command data "E0h", the controller die CD switches (toggles) the input signals of the external control terminals /RE and RE after a predetermined standby time. As a result, the data-out operation is started for the plane PLN0, and the user data "DataOut" is output via the data signal input and output terminals DQ<7:0>.

After the data-out operation for the plane PLN0 is completed, the command data "70h" is input via the data signal input and output terminals DQ<7:0>. Along with the input of the command data "70h", the status read is performed again, and the status data Stt is output via the data signal input and output terminals DQ<7:0>.

Next, the command data "05h", the address data Add, and the command data "E0h" are sequentially input via the data signal input and output terminals DQ<7:0>, as in the data-out operation for PLN0. The address data Add provided in this command set includes the information of the plane PLN1 (FIG. 4) that is the target of the data-out operation as the plane address.

After the lapse of a predetermined time, the controller die CD switches (toggles) the input signal of the external control terminals /RE and RE. As a result, the data-out operation is started for the plane PLN1, and the user data "DataOut" is output via the data signal input and output terminals DQ<7:0>.

[Read Operation and Data-Out Operation in Operation Mode MODEb]

Figure 18A:
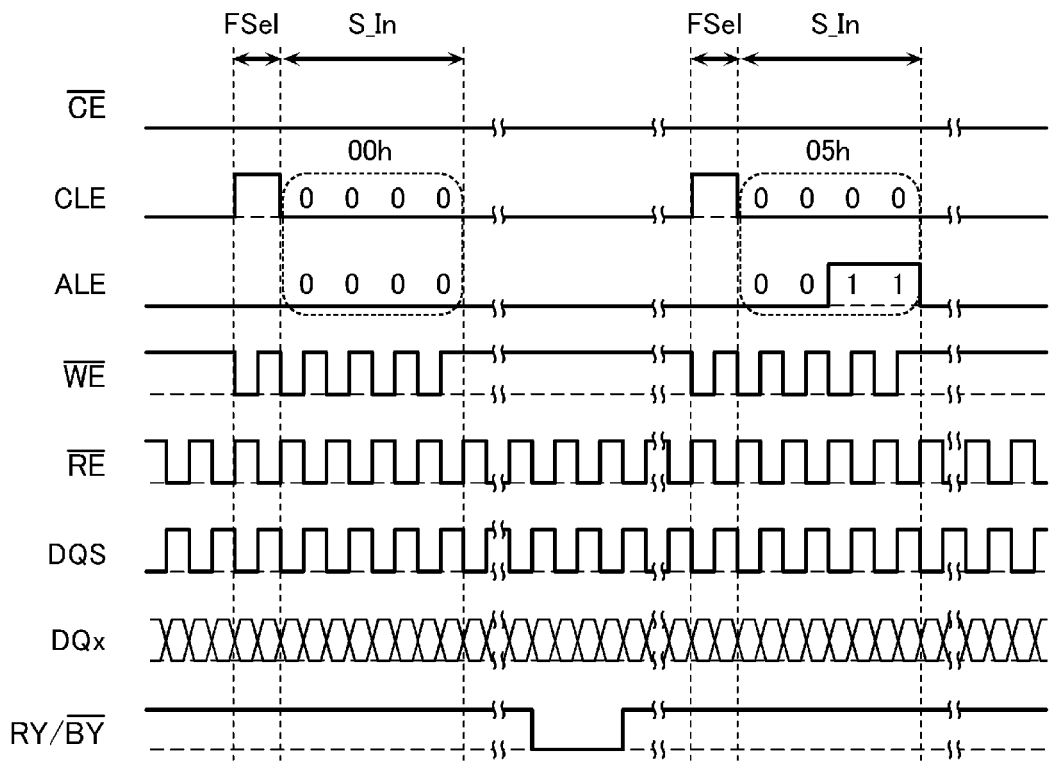
FIGS. 18A and 18B are schematic timing charts illustrating the operation mode MODEb.

FIG. 18A is a schematic timing chart showing a state when a read operation and a data-out operation are executed in the operation mode MODEb. In the example of FIG. 18A, the memory die MD is set to the operation mode MODEb.

In the example of FIG. 18A, first, a command set including the command data "00h" is input via the external control terminals CLE and ALE. Next, a command set including the command data "05h" is input via the external control terminals CLE and ALE. In the operation mode MODEb, data input and output via the data signal input and output terminals DQ<7:0> and data input and output via the external control terminals CLE and ALE can be executed at independent timings. For example, in the example of FIG. 18A, the input of these command sets is performed during the execution of the data-out operation (during the period when the input signals of the external control terminals /RE and RE are toggled).

[Status Read Operation in Operation Mode MODEb]

Figure 18B:
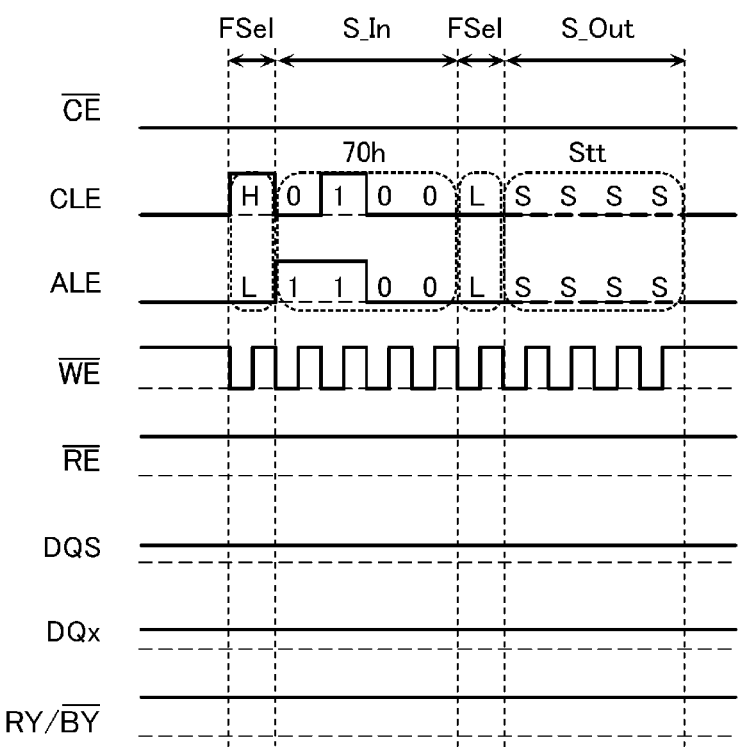

FIG. 18B is a schematic timing chart showing a state when the status read operation is executed in the operation mode MODEb. In the example of FIG. 18B, the memory die MD is set to the operation mode MODEb.

In the example of FIG. 18B, "L" and "H" are input to the external control terminal /WE at a substantially constant frequency. Further, the period from when the input signal of the external control terminal /WE drops once to when the input signal drops again at a predetermined timing is shown as the above-mentioned period FSel. Further, the period from the time when the input signal of the external control terminal /WE drops at the end of the period FSel to the time when the input signal of the external control terminal /WE drops four times is shown as the period S_In or the period S_Out.

That is, in the period FSel, when the controller die CD inputs the input and output data selection signal for designating the input of the command data Cmd or the address data Add to the memory die MD, the period immediately after that becomes the period S_In, and when the controller die CD inputs the input and output data selection signal for outputting the status data Stt to the memory die MD in the period FSel, the period immediately after that becomes the period S_Out.

First, the command data "70h" is input via the external control terminals CLE and ALE. Next, an input and output data selection signal for outputting the status data Stt is input. More specifically, as shown in FIG. 18B, in order to input an input and output data selection signal for outputting status data Stt in the period FSel of the operation mode MODEb, the controller die CD inputs, for example, "L" to the external control terminal CLE, inputs "L" to the external control terminal ALE, and then raises the external control terminal /WE from "L" to "H".

Further, as shown in FIG. 18B, in order to output the status data Stt during the period S_Out of the operation mode MODEb, the controller die CD, for example, lowers the input signal of the external control terminal /WE. Along with this, 2 bits of the status data Stt are output from the external control terminals CLE and ALE to the controller die CD by the output circuit 202. When the status data St is 8-bit data, the status data Stt is output in 4 cycles of 2 bits each.

Figure 19:
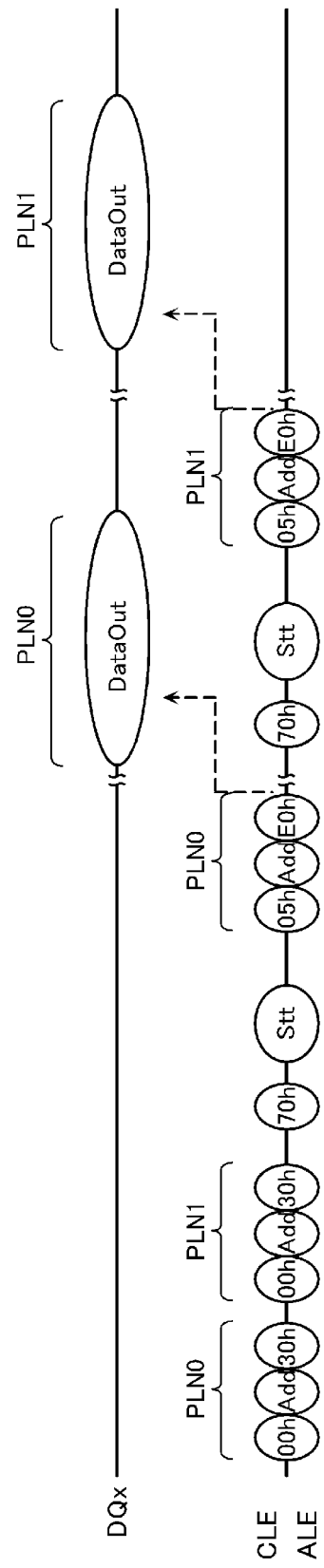
FIG. 19 is a schematic timing chart illustrating the operation mode MODEb.

FIG. 19 is a schematic timing chart showing another state when the read operation and the data-out operation are executed in the operation mode MODEb. In the example of FIG. 19, the memory die MD is set to the operation mode MODEb.

In the example of FIG. 19, first, the command data "00h", the address data Add, and the command data "30h" are sequentially input via the external control terminals CLE and ALE. The address data Add provided in this command set includes the information of the plane PLN0 (FIG. 4) to be read out as the plane address.

Next, the command data "00h", the address data Add, and the command data "30h" are sequentially input via the external control terminals CLE and ALE. The address data Add provided in this command set includes the information of the plane PLN1 (FIG. 4) to be read out as the plane address.

Next, the command data "70h" is input via the external control terminals CLE and ALE. Along with the input of the command data "70h", the status is read, and the status data Stt is output via the external control terminals CLE and ALE.

Next, the command data "05h", the address data Add, and the command data "E0h" are sequentially input via the external control terminals CLE and ALE. The address data Add includes information on the plane PLN0 (FIG. 4) that is the target of the data-out operation as the plane address.

After a predetermined standby time, the data-out operation is started for the plane PLN0, and the user data "DataOut" is output via the data signal input and output terminals DQ<7:0>.

Further, in the example of FIG. 19, the command data "70h" is input via the external control terminals CLE and ALE while the data-out operation for the plane PLN0 is being performed. Along with the input of the command data "70h", the status read is performed and the status data Stt is output via the external control terminals CLE and ALE. That is, in the present embodiment, the status read operation can be executed in parallel with the data-out operation.

Next, the command data "05h", the address data Add, and the command data "E0h" are sequentially input via the external control terminals CLE and ALE. The address data Add includes, as the plane address, the address of the plane PLN1 (FIG. 4) that is the target of the data-out operation.

Here, in the operation mode MODEb, unlike the operation mode MODEa, the data output timing adjustment unit TCT (FIG. 4) adjusts the start timing of the data-out operation with respect to the plane PLN1. After the data-out operation for the plane PLN0 is completed, the data-out operation for the plane PLN1 is started in response to the internal signal transmitted by the data output timing adjustment unit TCT, and the user data "DataOut" is output via the data signal input and output terminals DQ<7:0>.

[Mode Setting Operation of Comparative Example]

Figure 20:
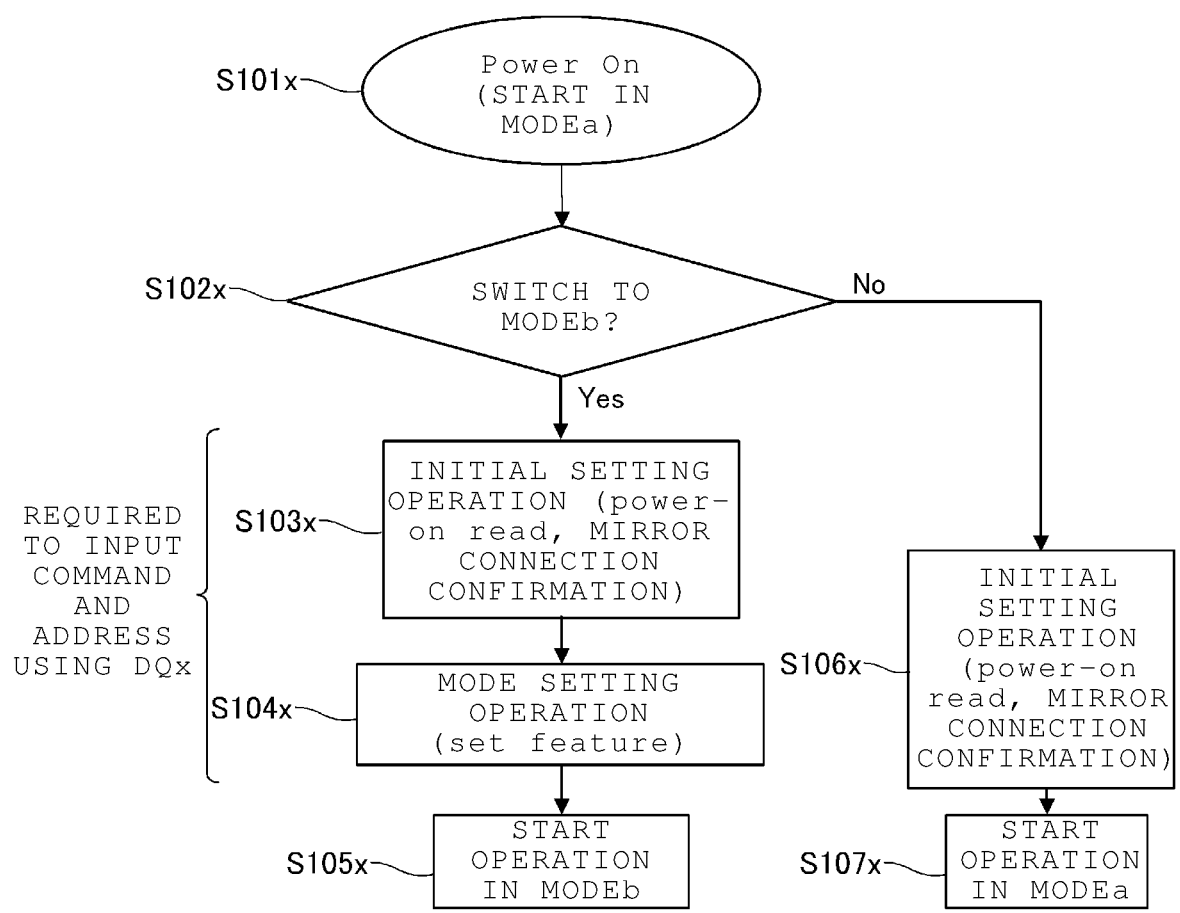
FIG. 20 is a schematic flowchart illustrating a mode setting operation of a semiconductor storage device according to a comparative example.
Figure 21:
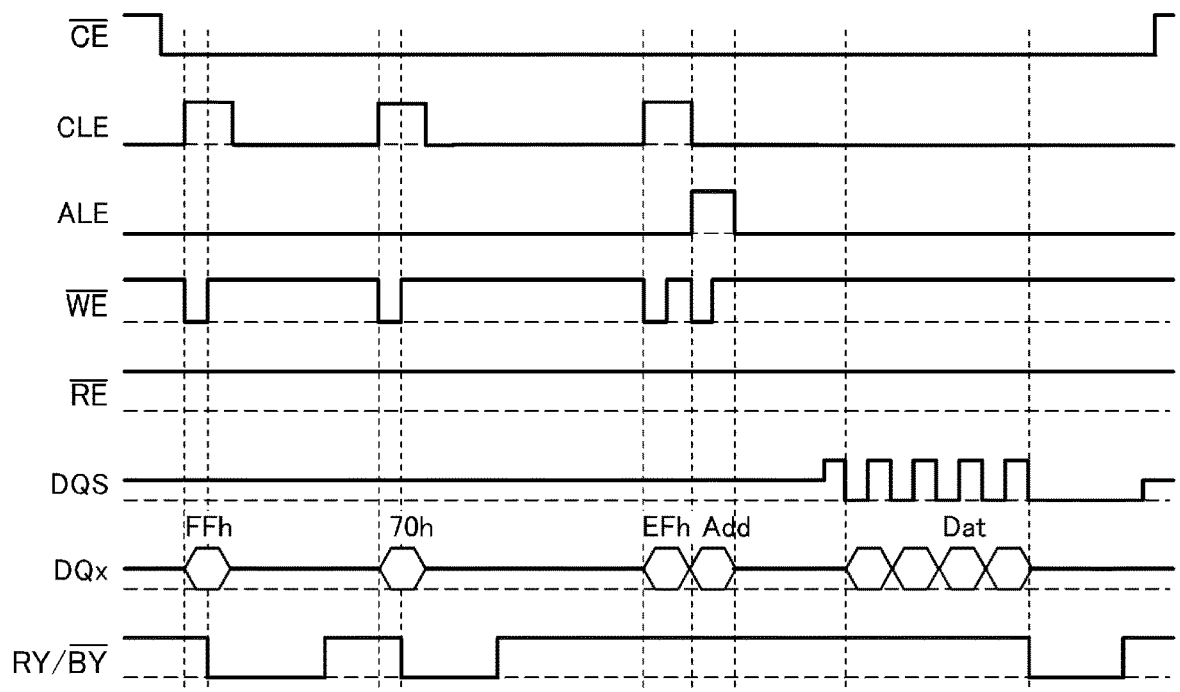
FIG. 21 is a schematic timing chart illustrating the mode setting operation of the semiconductor storage device according to the comparative example.

Next, the mode setting operation of the semiconductor storage device according to the comparative example will be described with reference to FIGS. 20 and 21. FIG. 20 is a schematic flowchart illustrating the mode setting operation of the semiconductor storage device according to the comparative example. FIG. 21 is a timing chart illustrating the mode setting operation of the semiconductor storage device according to the comparative example.

[Flow Including Mode Setting Operation of Comparative Example]

First, each step of the flow including the mode setting operation in the comparative example will be described with reference to FIG. 20. Each step of the flow shown in FIG. 20 is performed, for example, by the controller die CD.

In step S101x, a power supply operation as described later is performed. Immediately after the power supply operation in step S101x, the memory die MD is in the operation mode MODEa.

In step S102x, the controller die CD selects whether to switch the memory die MD from the operation mode MODEa to the operation mode MODEb. More specifically, the controller die CD may refer to the internal register which stores information as to the operation mode. Alternatively, the controller die CD may receive an instruction as to the operation mode from an external host device. When switching to the operation mode MODEb, the process proceeds to step S103x. If the operation mode is not switched to MODEb, the process proceeds to step S106x.

In step S103x, in the state where the memory die MD is set to the operation mode MODEa, the initial setting operation as described later is performed. The initial setting operation includes, for example, a power-on read operation and a mirror connection confirmation operation as described later.

In step S104x, the mode setting operation is performed. The mode setting operation is, for example, an operation in which the controller die CD shifts the memory die MD from the state of the operation mode MODEa to the state of the operation mode MODEb.

In step S105x, in a state where the memory die MD is set to the operation mode MODEb, various operations such as a read operation, a write operation, an erasing operation, a data-out operation, a status read, and the like are started based on a command from the controller die CD.

On the other hand, in step S106x, in the state where the memory die MD is set to the operation mode MODEa, the initial setting operation is performed based on the command from the controller die CD. In step S106x, the same operation as step S103x is performed.

In step S107x, in a state where the memory die MD is set to the operation mode MODEa, various operations as described above are started based on the command from the controller die CD.

[Timing Chart Including Mode Setting Operation of Comparative Example]

FIG. 21 is a schematic timing chart showing a state when the initial setting operation and the mode setting operation are executed in the comparative example. In the example of FIG. 21, at the start of the timing chart, the power supply voltage $V_{CC}$ is supplied by the power supply operation (Power on). Immediately after the power supply operation, the memory die MD is set to the operation mode MODEa. In other words, the memory die MD is configured to be in the operation mode MODEa when the power supply is cut off.

In the example of FIG. 21, the command data "FFh" is input via the data signal input and output terminals DQ<7:0> by the controller die CD in a state where the memory die MD is set to the operation mode MODEa immediately after the power supply operation. The command data "FFh" is the command data Cmd instructing the initial setting operation.

With the input of the command data "FFh", the initial setting operation is started at the timing when the external control terminal /WE rises from "L" to "H", and the voltage of the terminal RY//BY drops from "H" to "L". Further, after the lapse of a predetermined period, the voltage of the terminal RY//BY rises from "L" to "H" at the timing when the initial setting operation is completed.

Next, in the example of FIG. 21, the command data "70h" is input by the controller die CD via the data signal input and output terminals DQ<7:0> while the memory die MD is set to the operation mode MODEa. The command data "70h" is the command data Cmd instructing the mirror connection confirmation operation.

Along with the input of the command data "70h", the mirror connection confirmation operation is started at the timing when the external control terminal /WE rises from "L" to "H" and the voltage of the terminal RY//BY drops from "H" to "L". Further, after the lapse of a predetermined period, the voltage of the terminal RY//BY rises from "L" to "H" at the timing when the mirror connection confirmation operation is completed.

Next, in a state where the memory die MD is set to the operation mode MODEa, the command data "EFh", the address data Add, and the data Data are sequentially input by the controller die CD via the data signal input and output terminals DQ<7:0>. The command data "EFh" is the command data Cmd input at the beginning of the command set instructing the mode setting operation.

For example, in the example of FIG. 21, after the command data "EFh" and the address data Add are input, the data of 8-bit×4 cycles including the data Dat is input. With the input of data in the last cycle of data Dat, the mode setting operation is started at the timing when the data strobe signal input and output terminals DQS and /DQS drop from "H" to "L", and the voltage of the terminal RY//BY drops from "H" to "L". Further, after the lapse of a predetermined period, the voltage of the terminal RY//BY rises from "L" to "H" at the timing when the mode setting operation is completed.

After the above operation, the memory die MD can execute a normal read operation and a normal write operation in the operation mode MODEb.

[Mode Setting Operation of First Embodiment]

Figure 22:
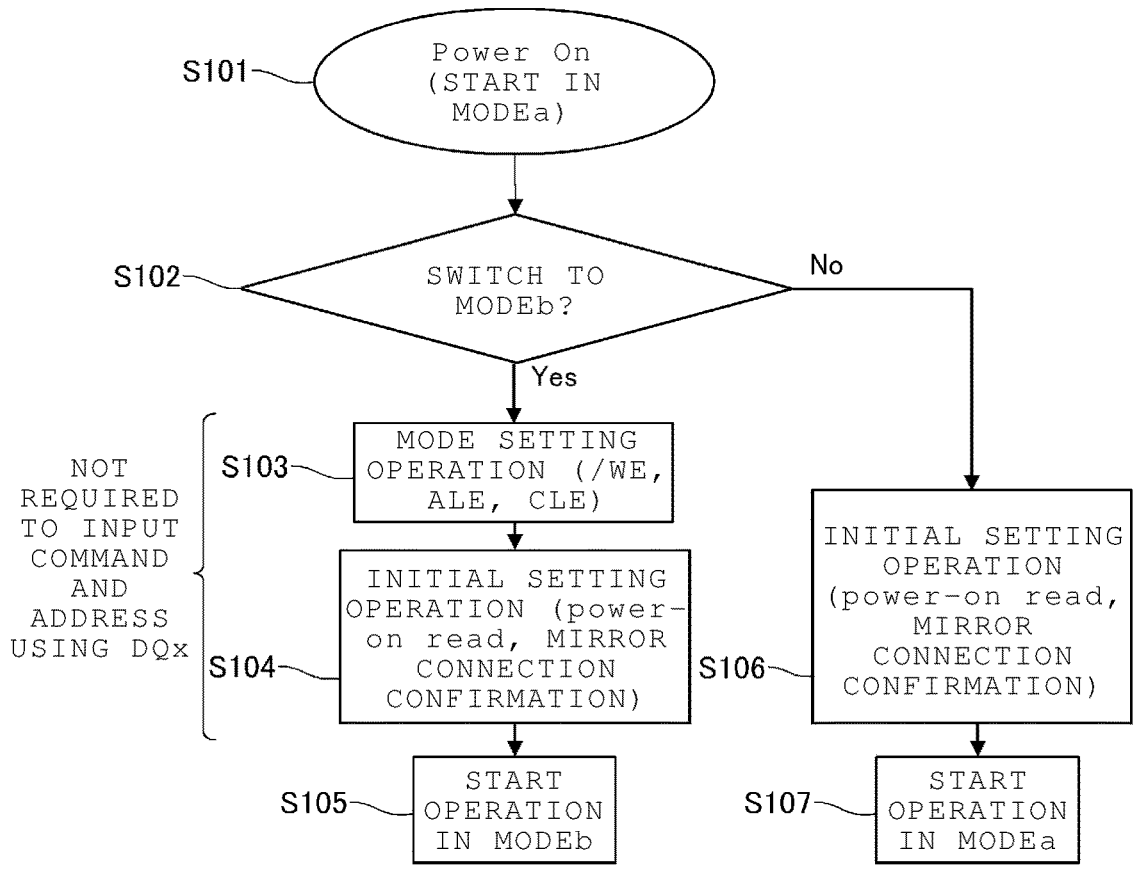
FIG. 22 is a schematic flowchart illustrating a mode setting operation of the semiconductor storage device according to the first embodiment.
Figure 23:
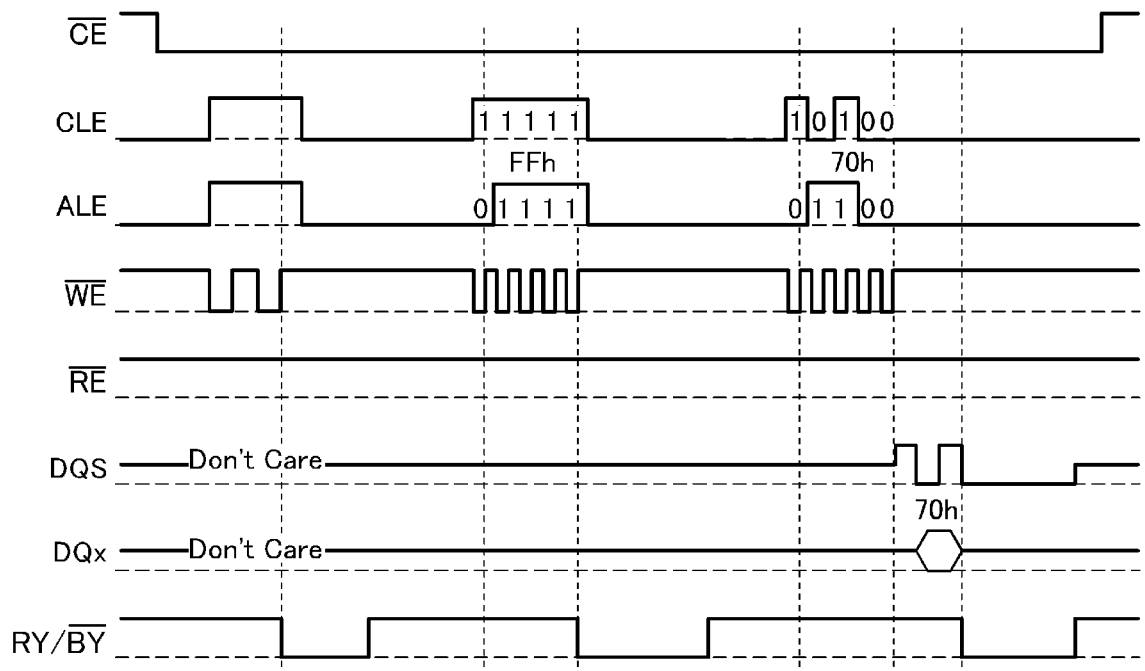
FIG. 23 is a schematic timing chart illustrating a mode setting operation of the semiconductor storage device according to the first embodiment.

Next, the mode setting operation of the semiconductor storage device according to the first embodiment will be described with reference to FIGS. 22 and 23. FIG. 22 is a schematic flowchart illustrating the mode setting operation of the semiconductor storage device according to the first embodiment. FIG. 23 is a timing chart illustrating the mode setting operation of the semiconductor storage device according to the first embodiment.

[Flow Including Mode Setting Operation of First Embodiment]

First, each step of the flow including the mode setting operation in the first embodiment will be described with reference to FIG. 22. Each step of the flow shown in FIG. 22 is performed, for example, by the controller die CD.

In step S101, a power supply operation is performed. The power supply operation is, for example, an operation of supplying the power supply voltage $V_{CC}$ to the corresponding pad electrode P (FIG. 4) of the memory die MD. As the power supply operation, the power supply voltage $V_{CC}$ may be started to be supplied to the controller die CD and the memory die MD, or the power supply voltage $V_{CC}$ may be started to be supplied to the memory die MD while maintaining the power-sharing with the controller die CD. Immediately after the power supply operation in step S101, the memory die MD is in the operation mode MODEa.

In step S102, the controller die CD selects whether to switch the memory die MD from the operation mode MODEa to the operation mode MODEb. When switching to the operation mode MODEb, the process proceeds to step S103. If the operation mode is not switched to MODEb, the process proceeds to step S106.

In step S103, the mode setting operation described above is performed. This mode setting operation is performed using the external control terminals CLE, ALE, and /WE.

As described above, immediately after the power supply operation, the memory die MD is set to the operation mode MODEa. More specifically, for example, before the execution of step S103, the feature data Fd for operating the memory die MD in the operation mode MODEa is stored in the feature register FR. In the mode setting operation, the feature data Fd is erased, and the feature data Fd for operating the memory die MD in the operation mode MODEb is newly set in the feature register FR. As a result, the operation mode MODEa is switched to the operation mode MODEb.

In step S104, the memory die MD performs the initial setting operation in the state of being set to the operation mode MODEb. The initial setting operation includes, for example, a power-on read operation and a mirror connection confirmation operation. Before the initial setting operation is completed, the memory die MD cannot perform a normal read operation, a normal write operation, or the like.

The power-on read operation includes, for example, an operation of reading the initial setting information required for the operation of the memory die MD from a predetermined region (setting information storage block) of the memory cell array MCA, and an operation of storing the necessary initial information in a register in the sequencer SQC.

The initial setting information includes information for operating the memory die MD properly. The initial setting information includes, for example, information indicating a defective block or a defective column unit, and information indicating driver setting values of the data signal input and output terminals DQ0 to DQ7. The initial setting information is stored in, for example, a register in the sequencer SQC during the operation of the memory die MD. However, the information stored in such a register disappears when the power supply is stopped. Therefore, in order to store the initial setting information even after the power supply is stopped, the initial setting information is stored in, for example, a predetermined region (setting information storage block) of the memory cell array MCA. Further, after the power supply is restarted, the initial setting information is read from the predetermined region (setting information storage block) of the memory cell array MCA by the power-on read operation described above, and the information is stored in the register in the sequencer SQC.

The mirror connection confirmation operation is an operation executed when the memory system 10 includes the normal connection package PKGa and the reverse connection package PKGb and includes a mirror connection, as described with reference to FIG. 3. For example, in the example of FIG. 3, the signals input to the data signal input and output terminals DQ1, 2, 3, 4, 5, 6, and 7 are reversed between the normal connection package PKGa and the reverse connection package PKGb. In particular, when data other than user data Dat (for example, command data Cmd, address data Add, status data Stt, feature data Fd) is reversed, the memory die MD may perform an unintended operation. Therefore, in the first embodiment, each package PKG executes a mirror connection confirmation operation in order to confirm whether its own state is a normal connection or a reverse connection.

The mirror connection confirmation operation is performed, for example, by inputting command data in an asymmetric array to the data signal input and output terminals DQ<7:0> in a state where the memory die MD is set to the operation mode MODEa. When the command data of the asymmetric array is input to the normal connection package PKGa, this command data is input normally. In such a case, it is determined that the package PKG is a normal connection package PKGa. On the other hand, when the command data in an asymmetric array is input to the reverse connection package PKGb, this command data is input in reverse. In such a case, it is determined that the package PKG is the reverse connection package PKGb. On the other hand, in the state where the memory die MD is set to the operation mode MODEb, the command data is not input via the data signal input and output terminals DQ<7:0>, so it is not possible to determine whether the memory die MD itself is the normal connection package PKGa or the reverse connection package PKGb only from the command data. Therefore, in the state where the memory die MD is set to the operation mode MODEb, during the mirror connection confirmation operation, as will be described later, the command data (for example, "70h") instructing the mirror connection confirmation operation is followed by dummy data (for example, "70h") for mirror connection confirmation are input via the data signal input and output terminals DQ<7:0>.

In step S105, in a state where the memory die MD is set to the operation mode MODEb, various operations as described above are started based on the command from the controller die CD.

In step S106, in the state where the memory die MD is set to the operation mode MODEa, the initial setting operation is performed based on the command from the controller die CD. In step S106, the same operation as step S103x of the comparative example is performed.

In step S107, in a state where the memory die MD is set to the operation mode MODEa, various operations as described above are started based on the command from the controller die CD.

[Timing Chart Including Mode Setting Operation of First Embodiment]

FIG. 23 is a schematic timing chart showing a state when the mode setting operation and the initial setting operation are executed in the first embodiment. In the example of FIG. 23, at the start of the timing chart, the power supply voltage $V_{CC}$ is supplied by the power supply operation and the memory die MD is set to the operation mode MODEa.

After the lapse of a predetermined time from the power supply operation, when the supplied power supply voltage $V_{CC}$ is stabilized, the next operation is performed. In the example of FIG. 23, the controller die CD toggles, for example, the input signal of the external control terminal /WE twice in a state where "H" is input to the external control terminal CLE, "H" is input to the external control terminal ALE. In the final toggle, the mode setting operation is started at the timing when the external control terminal /WE rises from "L" to "H", and the voltage of the terminal RY//BY drops from "H" to "L". Further, after the lapse of a predetermined period, the voltage of the terminal RY//BY rises from "L" to "H" at the timing when the mode setting operation is completed.

Next, in the example of FIG. 23, the input and output data selection signal (header) for designating the input of the command data Cmd and the 8-bit data including the command data "FFh" are input via the external control terminals CLE and ALE in the state where the memory die MD is set to the operation mode MODEb. The command data "FFh" is command data Cmd instructing the initial setting operation.

In the example of FIG. 23, the input signal of the external control terminal /WE is toggled five times when the header and the command data "FFh" are input. In the final toggle, at the timing when the external control terminal /WE rises from "L" to "H", the initial setting operation is started and the voltage of the terminal RY//BY drops from "H" to "L". Further, after the lapse of a predetermined period, the voltage of the terminal RY//BY rises from "L" to "H" at the timing when the initial setting operation is completed.

Next, in the example of FIG. 23, when the memory die MD is set to the operation mode MODEb, the input and output data selection signal (header) designating the input of the command data Cmd, and the command data "70h" are input via the external control terminals CLE and ALE. The command data "70h" is the command data Cmd instructing the mirror connection confirmation operation.

When inputting the header and command data "70h", the input signal of the external control terminal /WE is toggled 5 times. At the timing when the external control terminal /WE rises from "L" to "H" in the final toggle, the asymmetric dummy data required for mirror connection confirmation, for example, "70h", is input via the data signal input and output terminals DQ<7:0>. Further, when the data strobe signal input and output terminals DQS and /DQS to be toggled with the input of "70h" finally drops from "H" to "L", the mirror connection confirmation operation is started and the voltage of the terminal RY//BY drops from "H" to "L". Further, after the lapse of a predetermined period, the voltage of the terminal RY//BY rises from "L" to "H" at the timing when the mirror connection confirmation operation is completed.

After the above operation, the memory die MD can execute a normal read operation and a normal write operation in the operation mode MODEb.

[Effect]

As described above, the semiconductor storage device according to the comparative example is in the operation mode MODEa immediately after the power is turned on, and the initial setting operation and the mode setting operation immediately after the power is turned on must be performed in the operation mode MODEa. Therefore, even when the normal operation of the memory die MD is controlled by the operation mode MODEb, the memory system needs to be controlled by the operation mode MODEa only immediately after the power is turned on, which may make the control operation by the controller die CD complicated.

On the other hand, the semiconductor storage device according to the present embodiment is in the operation mode MODEa immediately after the power is turned on, but it is possible to switch from the operation mode MODEa to the operation mode MODEb by operating via the external control terminals CLE and ALE. In other words, the signal input using the data signal input and output terminals DQ<7:0> is not required to switch the memory die MD from the operation mode MODEa to the operation mode MODEb. Further, the initial setting operation can also be performed in a state where the memory die MD is set to the operation mode MODEb. Therefore, it is possible to prevent the control operation by the controller die CD from becoming complicated.

Second Embodiment

Next, the semiconductor storage device according to a second embodiment will be described with reference to FIG.

Figure 24:
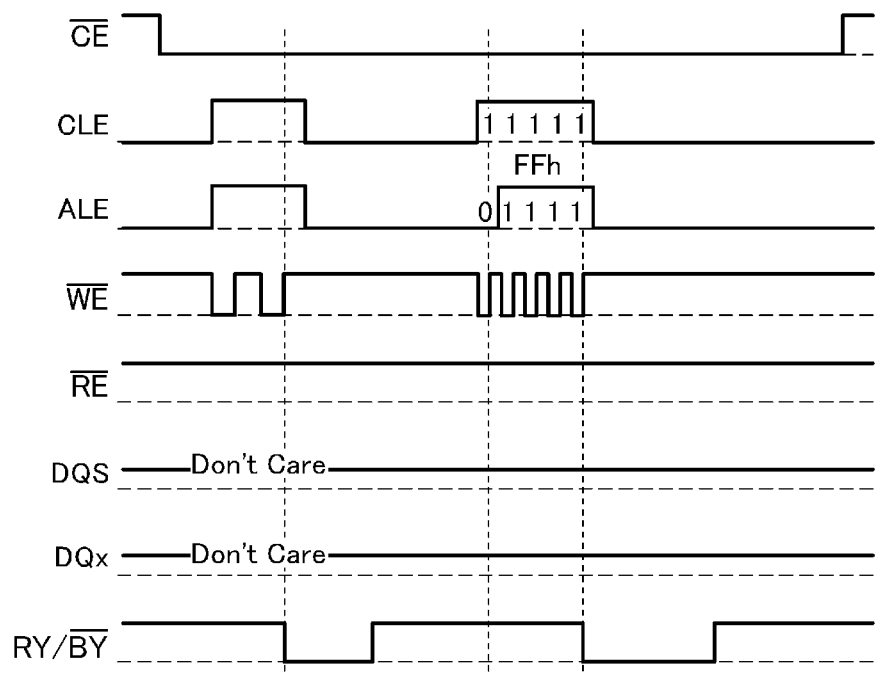
FIG. 24 is a schematic timing chart illustrating a mode setting operation of a semiconductor storage device according to a second embodiment.

24. FIG. 24 is a timing chart illustrating the mode setting operation of the semiconductor storage device according to the second embodiment. In the following description, the description of the same configuration and operation as in the first embodiment may be omitted.

[Mode Setting Operation of Second Embodiment]

In the example of FIG. 24, the power supply voltage $V_{CC}$ is supplied by the power supply operation at the start of the timing chart, and the memory die MD is set to the operation mode MODEa.

In the example of FIG. 24, the controller die CD toggles, for example, the input signal of the external control terminal /WE twice in a state where "H" is input to the external control terminal CLE and "H" is input to the external control terminal ALE, and the mode setting operation of shifting the memory die MD from the operation mode MODEa to the operation mode MODEb is performed.

Next, in the example of FIG. 24, as in the first embodiment, the header and the command data "FFh" are input in the operation mode MODEb and the initial setting operation is performed.

Here, in the semiconductor storage device according to the second embodiment, the mirror connection confirmation operation is not performed after the power-on read operation is completed. A configuration is also possible in which data other than user data Dat (for example, command data Cmd, address data Add, status data Stt, feature data Fd) is not input and output via the data signal input and output terminals DQ<7:0>.

After the above operation, the memory die MD can execute a normal read operation and a normal write operation in the operation mode MODEb.

[Others]

In the above description of the embodiment, an example is shown in which "H" is input to the external control terminal CLE and "H" is input to the external control terminal ALE in the mode setting operation. However, in the mode setting operation, "L" may be input to the external control terminal CLE and "L" may be input to the external control terminal ALE, or "L" may be input to the external control terminal CLE, and "H" may be input to the external control terminal ALE.

In addition, an example is shown in which the input signal of the external control terminal /WE is toggled twice in the mode setting operation. However, in the mode setting operation, the input signal of the external control terminal /WE may be toggled once or toggled three times or more.

In the above description, an example is shown in which the command data "FFh" becomes the command data Cmd instructing the power-on read operation when the command data "FFh" is input at the timing immediately after the power supply operation. However, the command data "FFh" may be the command data Cmd instructing the reset operation when the command data "FFh" is input at the timing after the power-on read operation is completed.

Further, an example is shown in which the command data "70h" is the command data Cmd instructing the mirror connection confirmation operation immediately after the power-on read operation. However, the command data "70h" may be the command data Cmd instructing the status read except immediately after the power-on read operation.

That is, the memory die may be configured to perform different operations depending on whether a certain command data is received at a first timing (for example, the timing immediately after the power supply operation) and at a second timing (the timing after the power-on read operation is completed).

Further, in the above description, in the operation mode MODEb, 2-bit data is input and output using the external control terminals CLE and ALE. However, such a method is merely an example and the specific method may be appropriately adjusted. For example, in the operation mode MODEb, data of 3 bits or more may be input and output by using other terminals (for example, an external control terminal /WP or the like described with reference to FIG. 4 or the like). Further, one or two terminals may be selected from the terminals including the external control terminals CLE and ALE to input and output 1-bit or 2-bit data.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
 a semiconductor storage device; and
 a memory controller, wherein
 the semiconductor storage device includes:
  a power supply pad to which power is supplied;
  a first signal pad to which a first signal is input;
  a second signal pad to which a second signal is input;
  a third signal pad to which a third signal is input;
  a fourth signal pad to which a fourth signal is input;
  a memory cell array;
  a data register in which data read from the memory cell array are stored; and
  a control circuit capable of executing a data-out operation of outputting data stored in the data register through the fourth signal pad, and
 the memory controller is configured to:
  perform a mode setting operation by toggling the third signal input to the third signal pad, after at least one of the first signal input to the first signal pad and the second signal input to the second signal pad has been switched from a first level to a second level at a first timing after supplying power to the power supply pad,
  perform an initial setting operation by transmitting a power-on read command to the semiconductor storage device at a second timing after the first timing, and
  transmit a data-out command to the semiconductor storage device, at a third timing after the second timing, wherein
 the semiconductor storage device receives the power-on read command and the data-out command via the first signal pad and the second signal pad.

2. The memory system according to claim 1, wherein the third signal is toggled twice or more after at least one of the first signal input to the first signal pad and the second signal input to the second signal pad has been switched from the first level to the second level.

3. The memory system according to claim 1, wherein in the mode setting operation,
 the third signal input to the third signal pad is toggled at least once after both the first signal input to the first signal pad and the second signal input to the second signal pad have been switched from the first level to the second level.

4. The memory system according to claim 1, wherein command data is transmitted to the first and second signal pads, and
address data is transmitted to the first and second signal pads.

5. The memory system according to claim 1, wherein in the initial setting operation,
the memory controller
transmits the power-on read command to the first and second signal pads
transmits a first command different from the power-on read command to the first and second signal pads after the power-on read command is transmitted, and
transmits first data to the fourth signal pad after the first command is transmitted.

6. The memory system according to claim 5, wherein the first data is a first array of data containing a plurality of bits, and
a second array of data containing a plurality of bits in an order that is reversed from that of the first array of data is different from the first array of data.

7. The memory system according to claim 1, wherein the control circuit includes a feature register that stores a result of the mode setting operation, and
the semiconductor storage device receives the power-on read command and the data-out command according to the result stored in the feature register.

8. A semiconductor storage device comprising:
a power supply pad to which power is supplied;
a first signal pad to which a first signal is input;
a second signal pad to which a second signal is input;
a third signal pad to which a third signal is input;
a fourth signal pad to which a fourth signal is input;
a memory cell array;
a data register in which data read from the memory cell array are stored; and
a control circuit is configured to:
perform a mode setting operation in response to a toggling of the third signal at the third signal pad, after at least one of the first signal input to the first signal pad and the second signal input to the second signal pad has been switched from a first level to a second level at a first timing after power is supplied to the power supply pad,
perform an initial setting operation in response to a power-on read command received via the first signal pad and the second signal pad at a second timing after the first timing, and
execute a data-out operation in response to a data-out command received via the first signal pad and the second signal pad at a third timing after the second timing.

9. The semiconductor storage device according to claim 8, wherein
the mode setting operation is performed in response to the toggling of the third signal at the third signal pad two or more times.

10. The semiconductor storage device according to claim 8, wherein
the mode setting operation is performed in response to the toggling of the third signal at the third signal pad at least once after both the first signal input to the first signal pad and the second signal input to the second signal pad have been switched from the first level to the second level.

11. The semiconductor storage device according to claim 8, wherein
command data is received through the first and second signal pads, and
address data is received through the first and second signal pads.

12. The semiconductor storage device according to claim 8, wherein in the initial setting operation,
a first command different from the power-on read command is received through the first and second signal pads after the power-on read command is received, and
first data is received through the fourth signal pad after the first command is received.

13. The semiconductor storage device according to claim 12, wherein
the first data is a first array of data containing a plurality of bits, and
a second array of data containing a plurality of bits in an order that is reversed from that of the first array of data is different from the first array of data.

14. The semiconductor storage device according to claim 8, wherein
the control circuit includes a feature register that stores a result of the mode setting operation, and
the power-on read command and the data-out command are received according to the result stored in the feature register.

15. A method of instructing a semiconductor storage device to perform an operation, wherein the semiconductor storage device includes a power supply pad to which power is supplied, a first signal pad to which a first signal is input, a second signal pad to which a second signal is input, a third signal pad to which a third signal is input, a fourth signal pad to which a fourth signal is input, a memory cell array, and a data register in which data read from the memory cell array are stored, said method comprising:
supplying power to the power supply pad;
toggling the third signal at the third signal pad, after switching at least one of the first signal input to the first signal pad and the second signal input to the second signal pad from a first level to a second level at a first timing after the power is supplied to the power supply pad;
transmitting a power-on read command via the first signal pad and the second signal pad at a second timing after the first timing; and
transmitting a data-out command via the first signal pad and the second signal pad at a third timing after the second timing, wherein data requested in the data-out command are received through the fourth signal pad.

16. The method according to claim 15, wherein
the third signal is toggled at least two times after at least one of the first signal input to the first signal pad and the second signal input to the second signal pad has been switched from the first level to the second level.

17. The method according to claim 15, wherein
the third signal is toggled at least once after both the first signal input to the first signal pad and the second signal input to the second signal pad have been switched from the first level to the second level.

18. The method according to claim 15, further comprising:
   transmitting command data through the first and second signal pads; and
   transmitting address data through the first and second signal pads.

19. The method according to claim 15, further comprising:
   transmitting a first command different from the power-on read command through the first and second signal pads after the power-on read command is transmitted; and
   transmitting first data through the fourth signal pad after the first command is transmitted.

20. The method according to claim 19, wherein
   the first data is a first array of data containing a plurality of bits, and
   a second array of data containing a plurality of bits in an order that is reversed from that of the first array of data is different from the first array of data.

* * * * *